US012776359B2

(12) United States Patent
Sethi et al.

(10) Patent No.: US 12,776,359 B2
(45) Date of Patent: Oct. 27, 2026

(54) MULTI BANK REFRESH IN VOLATILE MEMORY SYSTEMS

(71) Applicant: QUALCOMM Incorporated, San Diego, CA (US)

(72) Inventors: Saurabh Sethi, Mohali (IN); Vasantha Kumar Bandur Puttappa, Bangalore (IN); Amulya Srinivasan Margasahayam, Bangalore (IN); Madhukar Reddy N, Hyderabad (IN); Abhay Raj, Lucknow (IN)

(73) Assignee: Qualcomm Incorporated, San Diego, CA (US)

( * ) Notice: Subject to any disclaimer, the term of this patent is extended or adjusted under 35 U.S.C. 154(b) by 215 days.

(21) Appl. No.: 18/472,381

(22) Filed: Sep. 22, 2023

(65) Prior Publication Data

US 2025/0104758 A1 Mar. 27, 2025

(51) Int. Cl.
*G11C 11/406* (2006.01)

(52) U.S. Cl.
CPC .. *G11C 11/40618* (2013.01); *G11C 11/40603* (2013.01); *G11C 11/40615* (2013.01)

(58) Field of Classification Search
CPC ........ G11C 11/40618; G11C 11/40603; G11C 11/40615; G11C 11/40611; G11C 11/40626; G06F 13/1636
See application file for complete search history.

(56) References Cited

U.S. PATENT DOCUMENTS 10,878,879 B2 12/2020 Liu et al.
11,694,739 B2 7/2023 Brandl et al.
11,735,246 B2 8/2023 Hatakeyama et al.
2008/0151670 A1 6/2008 Kawakubo et al.
2013/0080694 A1* 3/2013 Iyer .................. G11C 11/40618 711/E12.078
2014/0068171 A1* 3/2014 Lee .................. G11C 11/40615 711/106
2020/0227114 A1 7/2020 Lee
2023/0029003 A1 1/2023 Johnson et al.

FOREIGN PATENT DOCUMENTS

WO WO-2023154596 8/2023

OTHER PUBLICATIONS

International Search Report and Written Opinion—PCT/US2024/040314—ISA/EPO—Oct. 25, 2024.

* cited by examiner

*Primary Examiner* — Sultana Begum

(74) *Attorney, Agent, or Firm* — MUNCY, GEISSLER, OLDS & LOWE, PC

(57) ABSTRACT

Various embodiments include methods for implementing a multi-bank memory refresh command on memory devices. A memory controller may select a number of memory banks to refresh in a refresh cycle, select a first memory bank to refresh, and send the memory device a multi-bank of memory refresh command that encodes the number of memory banks and the first memory bank to refresh. The memory device may recognize the multi-bank memory refresh command based on signals received over a number of clock cycles, decode the command to identify the number of memory banks to refreshed and the first memory bank to refresh, and then refresh the identified number of memory banks starting from the identified first memory bank.

12 Claims, 16 Drawing Sheets

300

| SDRAM COMMAND | DDR COMMAND PIN | | | | | CK_t edge |
|---|---|---|---|---|---|---|
| | CS | CA0 | CA1 | CA2 | CA3 | |
| **Multi Bank Refresh (originally RFU)** | H | H | H | H | L | R1 |
| | x | L | H | L | nB2 | F1 |
| | H | nB1 | nB0 | mREF1 | mREF0 | R2 |
| | x | BA0 | BA1 | BG0 | BG1 | F2 |

FIG. 3A

302

| nB2 | nB1 | nB0 | Number of Banks to be refreshed |
|---|---|---|---|
| 0 | 0 | 0 | RFU* (can be 2) |
| 0 | 0 | 1 | 4 |
| 0 | 1 | 0 | 6 |
| 0 | 1 | 1 | 8 |
| 1 | 0 | 0 | 10 |
| 1 | 0 | 1 | 12 |
| 1 | 1 | 0 | 14 |
| 1 | 1 | 1 | RFU* (can be 16) |

FIG. 3B

304

| mREF1 | mREF0 | Pattern of Banks to be refreshed |
|---|---|---|
| 0 | 0 | Increment |
| 0 | 1 | Pair |
| 1 | 0 | Step of 2 |
| 1 | 1 | Diagonal |

FIG. 3C

306

| BA0 | BA1 | BG0 | BG1 | Bank no |
|---|---|---|---|---|
| 0 | 0 | 0 | 0 | 0 |
| 1 | 0 | 0 | 0 | 1 |
| 0 | 1 | 0 | 0 | 2 |
| 1 | 1 | 0 | 0 | 3 |
| 0 | 0 | 1 | 0 | 4 |
| 1 | 0 | 1 | 0 | 5 |
| 0 | 1 | 1 | 0 | 6 |
| 1 | 1 | 1 | 0 | 7 |
| 0 | 0 | 0 | 1 | 8 |
| 1 | 0 | 0 | 1 | 9 |
| 0 | 1 | 0 | 1 | 10 |
| 1 | 1 | 0 | 1 | 11 |
| 0 | 0 | 1 | 1 | 12 |
| 1 | 0 | 1 | 1 | 13 |
| 0 | 1 | 1 | 1 | 14 |
| 1 | 1 | 1 | 1 | 15 |

FIG. 3D

306

| SDRAM COMMAND | DDR COMMAND PIN | | | | | | | CK_t edge |
|---|---|---|---|---|---|---|---|---|
| | CS | CA0 | CA1 | CA2 | CA3 | . | CA*n*-1 | |
| **Multi Bank Refresh** | H | H | H | H | L | | | R1 |
| | x | L | H | L | . | . | | F1 |
| | . | | | | | | | . |
| | . | | **mREFt-1** | . | . | . | **mREF0** | . |
| | H | **B0** | **B1** | . | . | . | **Bz-1** | R*m* |
| | x | **BA0** | **BA1** | . | **BG0** | **BG1** | . | F*m* |

*n* command pins

Opcode is *k* bits in shaded entries

No of patterns supported 2^*t* represented by *t* bits

No of banks to be refreshed encoded in *z* bits

Start bank address encoded in *y* bits

Command is *m* cycles long

*k* (opcode) + *t* (pattern encoding) + *z* (no of banks) + *y* (start bank address) <= *n* *2*m*

FIG. 3E

600
| SDRAM COMMAND | DDR COMMAND PIN | | | | | CK_t edge |
|---|---|---|---|---|---|---|
| | CS | CA0 | CA1 | CA2 | CA3 | |
| **Multi Bank Refresh (originally RFU)** | H | H | H | H | L | R1 |
| | x | L | H | L | H | F1 |
| | H | H | L | L | L | R2 |
| | x | L | L | L | H | F2 |
FIG. 6A
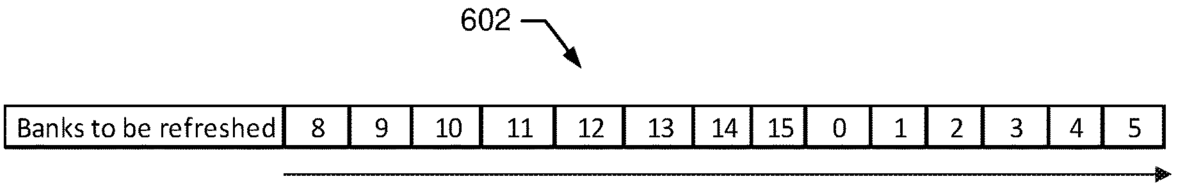
FIG. 6B
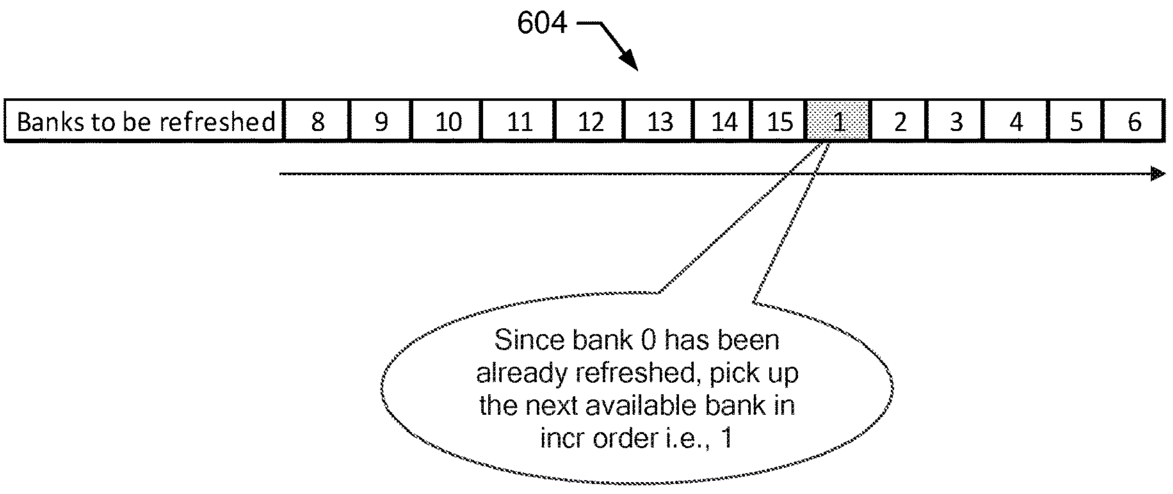
FIG. 6C

700

| SDRAM COMMAND | DDR COMMAND PIN | | | | | CK_t edge |
|---|---|---|---|---|---|---|
| | CS | CA0 | CA1 | CA2 | CA3 | |
| **Multi Bank Refresh (originally RFU)** | H | H | H | H | L | R1 |
| | x | L | H | L | H | F1 |
| | H | L | L | L | H | R2 |
| | x | L | L | H | H | F2 |

702

| | | | | | | | | | |
|---|---|---|---|---|---|---|---|---|---|
| Banks to be refreshed | 12 | 4 | 13 | 5 | 14 | 6 | 15 | 7 | 8 | 0 |

704

800
| SDRAM COMMAND | DDR COMMAND PIN | | | | | CK_t edge |
|---|---|---|---|---|---|---|
| | CS | CA0 | CA1 | CA2 | CA3 | |
| **Multi Bank Refresh (originally RFU)** | H | H | H | H | L | R1 |
| | x | L | H | L | H | F1 |
| | H | L | H | H | L | R2 |
| | x | L | H | L | L | F2 |
FIG. 8A
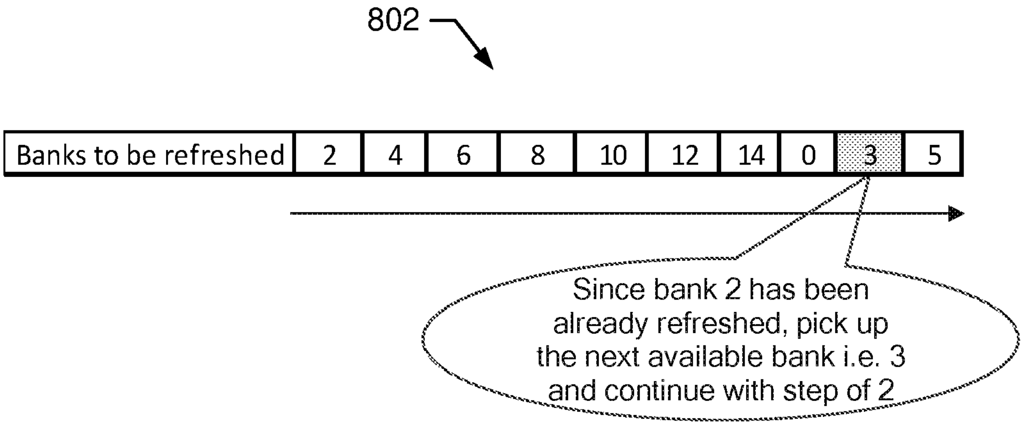
FIG. 8B
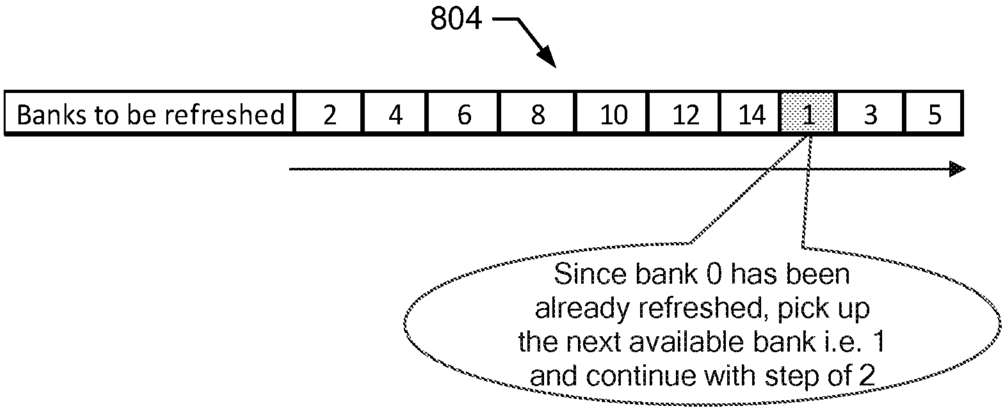
FIG. 8C 900
| SDRAM COMMAND | DDR COMMAND PIN | | | | | CK_t edge |
|---|---|---|---|---|---|---|
| | CS | CA0 | CA1 | CA2 | CA3 | |
| **Multi Bank Refresh (originally RFU)** | H | H | H | H | L | R1 |
| | x | L | H | L | L | F1 |
| | H | H | H | H | H | R2 |
| | x | L | H | H | L | F2 |
FIG. 9A
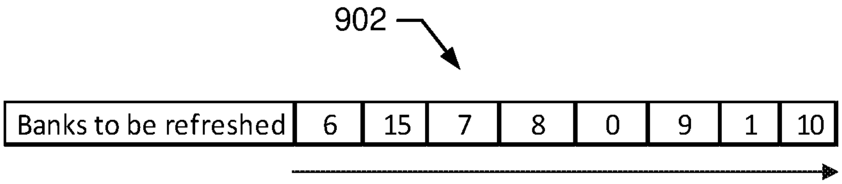
FIG. 9B
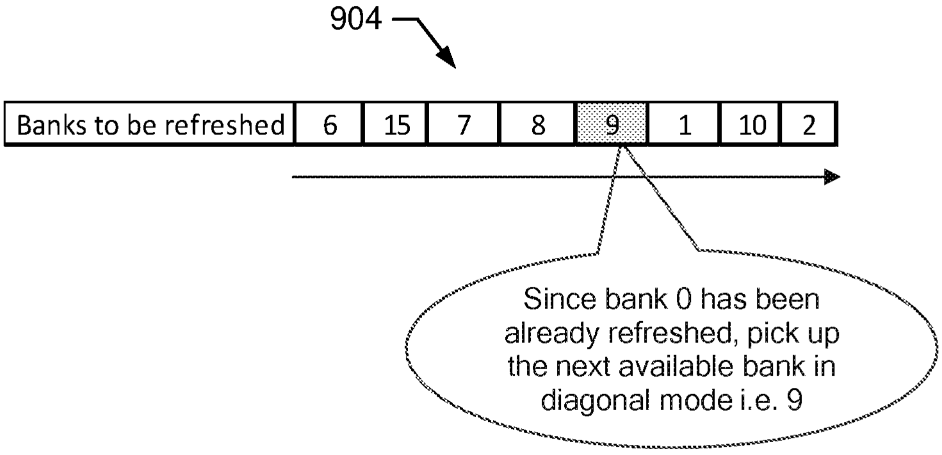
FIG. 9C

MULTI BANK REFRESH IN VOLATILE MEMORY SYSTEMS

BACKGROUND

Dynamic random access memory (DRAM) cells require periodic refreshing to raise the voltage in each cell back to a full charge state in order to prevent data loss due to normal voltage leakage. The refresh rate required for memory cells may be temperature dependent as increased temperature causes increased voltage leakage. Currently, technical specifications for volatile memory devices allow for all bank refresh (ABR) in which all memory cells in all banks of the memory are refreshed at the same time, and per bank refresh (PBR) in which memory cells in each bank of memory are refreshed. The frequency and ways in which memory cells are refreshed may impact device performance due to unavailability of the memory during refresh or increased congestion on the command/address bus during refresh. As the operating temperature of a memory increases, the potential impacts on performance may increase.

SUMMARY

Various aspects include methods and memory controllers for implementing multi bank refresh commands that provide flexibility in managing the refresh requirements of DRAM memory. Various aspects may include methods of performing multi-memory bank refreshes of volatile memory devices performed by a memory controller. Such aspect methods may include selecting a number of memory banks to refresh in a multi-bank memory refresh cycle, selecting a first memory bank to refresh in the multi-bank refresh cycle, and applying a multi-bank of memory refresh command to a memory device, in which the multi-bank of memory refresh command may encode the number of memory banks to be refreshed, and the first memory bank to refresh. In some aspects, the multi-bank of memory refresh command may encode the number of memory banks to be refreshed in z bits, in which z is an integer, and the multi-bank of memory refresh command is completed in m clock cycles, in which m is an integer. In some aspects, z equals 3 and m equals 2.

Some aspects may further include selecting one of a plurality of different patterns of memory bank refreshing sequences, in which the multi-bank of memory refresh command also may encode the pattern for refreshing particular memory banks. In some aspects, selecting one of a plurality of different patterns of memory bank refreshing sequences may include selecting one of an incremental pattern, a pairwise pattern based on pairs of memory banks specified for the memory device, a step of N pattern, or a diagonal pattern based on the pairs of memory banks specified for the memory device. In some aspects, N equals 2.

Further aspects include methods of implementing a multi-bank memory refresh command on a memory device. Such aspect methods may include recognizing a multi-bank memory refresh command based on signals applied to command and address pins over a number m of clock cycles, in which m is an integer, identifying a number of memory banks to be refreshed based on the signals applied to the command and address pins over the m clock cycles, identifying a first memory bank to be refreshed based on the signals applied to the command and address pins over at least one clock cycle, and refreshing the identified number of memory banks within the memory device starting from the identified first memory bank. In some aspects, m equals 2. In some aspects, the multi-bank of memory refresh command may encode the number of memory banks to be refreshed in z bits, in which z is an integer. In some aspects, z equals 3.

Some aspects may further include identifying a pattern for refreshing particular memory banks based on the signals applied to the command and address pins over at least one clock cycle, and refreshing the identified number of memory banks within the memory device according to the pattern for refreshing particular memory starting from the identified first memory bank. Some aspects may further include selecting a next memory bank for refreshing according to the identified pattern for refreshing particular memory banks, determining whether the selected memory bank has already been refreshed, refreshing the selected memory bank in response to determining that the selected memory bank has not already been refreshed, and selecting a next memory bank for refreshing in response to determining that the selected memory bank has already been refreshed.

Some aspects may further include determining whether the identified number of memory banks have been refreshed, selecting the next memory bank for refreshing in response to determining that the identified number of memory banks have not yet been refreshed, and ending the multi-bank memory refresh in response to determining that the identified number of memory banks have been refreshed.

Further aspects include a computing device including a memory and a memory controller configured to perform operations of any of the methods summarized above. Further aspects include a computing device having means for accomplishing functions of any of the methods summarized above. Further aspects include a non-transitory processor-readable storage medium having stored thereon processor-executable software instructions configured to cause a processor and/or processing system to perform operations of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIGS. 3A-3D are tables illustrating non-limiting examples of multi-bank memory refresh command and data encoding tables according to a non-limiting embodiment.

FIG. 3E is a table illustrating an example of a general format for multi-bank memory refresh commands according to various embodiments.

FIGS. 6A-6C are tables illustrating a non-limiting example of a multi-bank memory refresh command specifying an incremental multi-bank memory refresh pattern and examples of the memory banks that would be refreshed in response to the command according to a non-limiting embodiment.

FIGS. 8A-8C are tables illustrating a non-limiting example of a multi-bank memory refresh command specifying a step of N multi-bank memory refresh pattern in which N=2 and examples of the memory banks that would be refreshed in response to the command according to a non-limiting embodiment.

FIGS. 9A-9C are tables illustrating a non-limiting example of a multi-bank memory refresh command specifying a diagonal multi-bank memory refresh pattern and examples of the memory banks that would be refreshed in response to the command according to a non-limiting embodiment.

DETAILED DESCRIPTION

Figure 1:
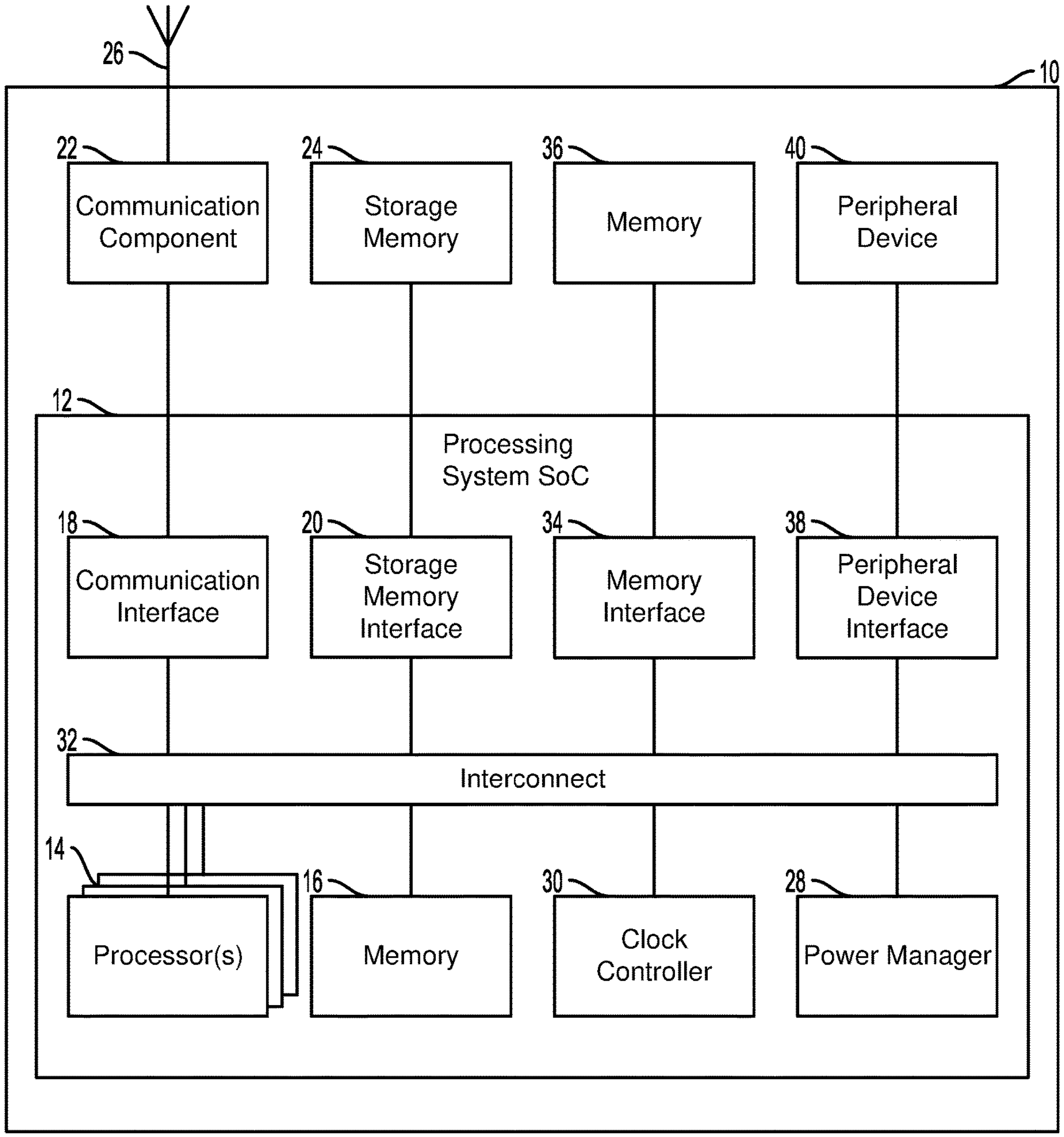
FIG. 1 is a component block diagram illustrating an example computing device suitable for implementing various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods, and computing devices implementing such methods of multi bank refresh of DRAM memory devices according to flexible refresh commands that provide flexibility in identifying which banks of memory are refreshed and the sequences in which identified banks are refreshed. Various embodiments include defining a multi-bank refresh command that enables a memory controller to choose the number of memory banks and the desired memory banks in volatile memory devices, such as but not limited to double data rate (DDR) and low power double data rate (LPDDR) memory devices. Various embodiments may enable the memory controller to specify the number of memory banks to be refreshed, the starting bank number, and the pattern of memory banks to be refreshed following the starting bank. Various embodiments may help to minimize performance loss by enabling the memory controller to issue refreshes to multiple idle banks. Various embodiments may be applicable to a variety of volatile memory device technologies.

The term "computing device" is used herein to refer to stationary computing devices including personal computers, desktop computers, all-in-one computers, workstations, super computers, mainframe computers, embedded computers (such as in vehicles and other larger systems), computing systems within or configured for use in vehicles, servers, multimedia computers, and game consoles. The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor.

The term "processing system" is used herein to refer to one more processors, including multi-core processors, that are organized and configured to perform various computing functions. Various embodiment methods may be implemented in one or more of multiple processors within a vehicle processing system as described herein.

The term "system on chip" (SoC) is used herein to refer to a single integrated circuit (IC) chip that contains multiple processors, memory and supporting resources, which may form a processing system integrated on a single substrate. A SoC may contain circuitry for digital, analog, mixed-signal, and radio-frequency functions. A single SoC processing system also may include any number of general-purpose or specialized processors (e.g., network processors, digital signal processors, modem processors, video processors, etc.), memory blocks (e.g., ROM, RAM, Flash, etc.), and resources (e.g., timers, voltage regulators, oscillators, etc.). For example, an SoC processing system may include an applications processor that operates as the SoC's main processor, a central processing unit (CPU), a microprocessor unit (MPU), an arithmetic logic unit (ALU), etc. SoC processing systems also may include software for controlling integrated resources and processors, as well as for controlling peripheral devices.

The term "system in a package" (SIP) may be used herein to refer to a single module or package that contains a processing system including multiple resources, computational units, cores, or processors on two or more IC chips, substrates, or SoCs. For example, a SIP processing system may include a single substrate on which multiple IC chips or semiconductor dies are stacked vertically. Similarly, the SIP processing system may include one or more multi-chip modules (MCMs) on which multiple ICs or semiconductor dies are packaged into a unifying substrate. A SIP processing system also may include multiple independent SOCs coupled together via high-speed communication circuitry and packaged in close proximity, such as on a single motherboard, in a single UE, or in a single CPU device. The proximity of the SoCs facilitates high-speed communications and the sharing of memory and resources.

Volatile memory cells, such as MDRAM, DDR and LPDDR memory cells, require periodic refreshes that recharge cells to the full charge state to prevent data loss due to voltage leakage. Current JEDEC specifications mandate refreshes to all the memory banks in a time interval (referred to herein as "tREFI"). LPDDR specifications currently only allow two types of refresh commands; all bank refresh (ABR) and per bank refresh (PBR) commands. Under some circumstances, these two refresh command options can lead to either performance degradation or increased command and address (CA) bus congestion, respectively. At higher refresh rates, these limitations may be exacerbated.

All bank refresh commands refresh all banks at once, thus stalling traffic for a time interval ("tRFCab") that is longer than the time interval ("tRFCpb") of a per bank refresh command. As a result, all bank refresh reduces command and address bus congestion but can lead to performance degradation of up to 30-40%.

Per bank refresh refreshes only two banks at a time. Subsequent per bank refresh commands can be sent out by the memory controller after the time interval between two per bank refreshes to different banks. As a result, per bank refresh reduces performance degradation but increases command and address bus congestion.

Also, for some refresh rates, such as for 4×/8× that is important for high temperature applications, such as in automobile computing systems, it might not be possible to schedule all 8 Per Bank Refresh commands in the time interval tREFI. This could lead to performance degradation due to the need to force all bank refresh commands.

Various embodiments solve some of the limitations in current JEDEC specifications for memory bank refresh by providing a flexible multi bank refresh command that provides flexibility to minimize both performance degradation and command and address bus congestion. The multi bank refresh commands of various embodiments provide the memory controller with flexibility to choose the number of memory banks and the desired banks in volatile memory devices (e.g., DDR/LPDDR memory devices) to be refreshed in any given refresh cycle. The flexible refresh command of various embodiments may enable DRAM controllers to incorporate smart refresh algorithms that can be responsive to the nature of the workload of the processing system and memory at any given instant. Some embodiments include a defined multi bank refresh command using an existing reserved for future use (RFU) command of the current JEDEC Low Power Double Data Rate specification, which is applicable to past and future DDRx/LPDDRx specifications. Such embodiments use a number of bits available in the RFU command for each DDR/LPDDR generation to define the number of memory banks to be refreshed, a starting bank number, and a pattern of memory banks to be refreshed in sequence following the starting memory bank. Various embodiments may enable the memory controller to minimize performance loss by issuing refreshes to multiple idle memory banks, and reducing command and address bus congestion by issuing fewer refresh commands per time interval for completing refreshes to all memory banks as mandated by the specification. This solution is applicable for all volatile memory specs.

Various embodiments may be particularly advantageous in high temperature applications, such as in computing devices deployed in automobiles. For example, DDR memory has to increase the memory refresh rate when temperature of the DDR memory increases to certain levels in order to maintain integrity of data stored in the DDR memory. Increasing the memory refresh rate reduces read/write bandwidth and increases latency for the DDR memory.

Various embodiments improve the operation of computing and processing devices in a variety of application by enabling refresh to be scheduled in a manner consistent with executing operations by providing flexibility for a memory controller to choose the number of memory banks to be refreshed and/or choose which banks to be refreshed. Various embodiments may reduce memory performance degradation and command and address bus congestion by providing flexibility that enables smart refresh scheduling. The refresh schema of various embodiments may be of particular benefit in applications requiring high refresh rates, such as in high temperature environments such as experienced in automotive computing devices. Further, the proposed commands of various embodiments may be scalable across volatile memory specifications, and may be modified to meet different memory configurations and needs.

FIG. 1 illustrates a processing system including a computing device 10 suitable for use with various embodiments. With reference to FIG. 1, the computing device 10 may include a system-on-chip (SoC) processing system 12 with one or more processors 14, one or more memories 16, a communication interface 18, a storage memory interface 20, a memory interface 34, a power manager 28, a clock controller 30, a peripheral device interface 38, and an interconnect 32. A computing device 10 may further include a communication component 22, such as a wired or wireless modem, a storage memory 24, an antenna 26 for establishing a wireless communication link, a memory 36, and a peripheral device 40.

A computing device 10 processing system 12 may include a variety of different types of processors 14 and processor cores, such as one or more general purpose processors, a central processing unit (CPU), a digital signal processor (DSP), a graphics processing unit (GPU), an accelerated processing unit (APU), a secure processing unit (SPU), a subsystem processor of specific components of the computing device, such as an image processor for a camera subsystem or a display processor for a display, an auxiliary processor, a single-core processor, a multicore processor, a controller, and a microcontroller. A processing system 12 may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

A computing device 10 may include more than one SoC processing systems 12, thereby increasing the number of processors 14 and processor cores. The computing device 10 may also include processors 14 of a processing system that are not associated with an SoC 12. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster.

The memories 16, 36 of the SoC 12 may be a volatile or non-volatile memory configured for storing data and processor-executable code for access by the processor 14. The computing device 10 and/or SoC 12 may include one or more memories 16, 36 configured for various purposes. One or more memories 16, 36 may include volatile memories such as random access memory (RAM) or main memory, including dynamic RAM (DRAM), or cache memory. These memories 16, 36 may be configured to temporarily hold a limited amount of data received from a data sensor or subsystem, data and/or processor-executable code instructions that are requested from a non-volatile memory 16, 24, loaded to the memories 16 from the non-volatile memory 16, 24 in anticipation of future access based on a variety of factors, and/or intermediary processing data and/or processor-executable code instructions produced by the processor 14 and temporarily stored for future quick access without being stored in non-volatile memory 16, 24. The memory interface 34 and the memory 36 may work in unison to allow the computing device 10 to load and retrieve data and processor-executable code on the memory 36.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

The power manager 28 may be configured to control power states of one or more power rails (not shown) for power delivery to the components of the SoC 12. In some embodiments, the power manager 28 may be configured to control amounts of power provided to the components of the SoC 12. For example, the power manager 28 may be configured to control connections between components of the SoC 12 and the power rails. As another example, the power manager 28 may be configured to control amounts of power on the power rails connected to the components of the SoC 12. The power manager 28 may be configured as a power management integrated circuit (power management ICs or PMIC).

A clock controller 30 may be configured to control clock signals transmitted to the components of the SoC 12. For example, the clock controller 30 may gate a component of the SoC 12 by disconnecting the component of the SoC 12 from a clock signal and may ungate the component of the SoC 12 by connecting the component of the SoC 12 to the clock signal.

A peripheral device interface 38 may enable components of the SoC 12, such as the processor 14 and/or the memory 16, to communicate with a peripheral device 40. The peripheral device interface 38 may provide and manage physical and logical connections between the components of the SoC 12 and the peripheral device 40. The peripheral device interface 38 may also manage communication between the components of the SoC 12 and the peripheral device 40, such as by directing and/or allowing communications between transmitter and receiver pairs of the components of the SoC 12 and the peripheral device 40 for a communication. The communications may include transmission of memory access commands, addresses, data, interrupt signals, state signals, etc. A peripheral device 40 may be any component of the computing device 10 separate from the SoC 12, such as a processor, a memory, a subsystem, etc. In some embodiments, the peripheral device interface 38 may include a PCIe root complex and may enable PCIe protocol communication between the components of the SoC 12 and the peripheral device 40.

The interconnect 32 may be a communication fabric, such as a communication bus including a number of lines (i.e., conductors), configured to communicatively connect the components of the SoC 12. The interconnect 32 may transmit signals between the components of the SoC 12. In some embodiments, the interconnect 32 may be configured to control signals between the components of the SoC 12 by controlling timing and/or transmission paths of the signals.

Figure 2:
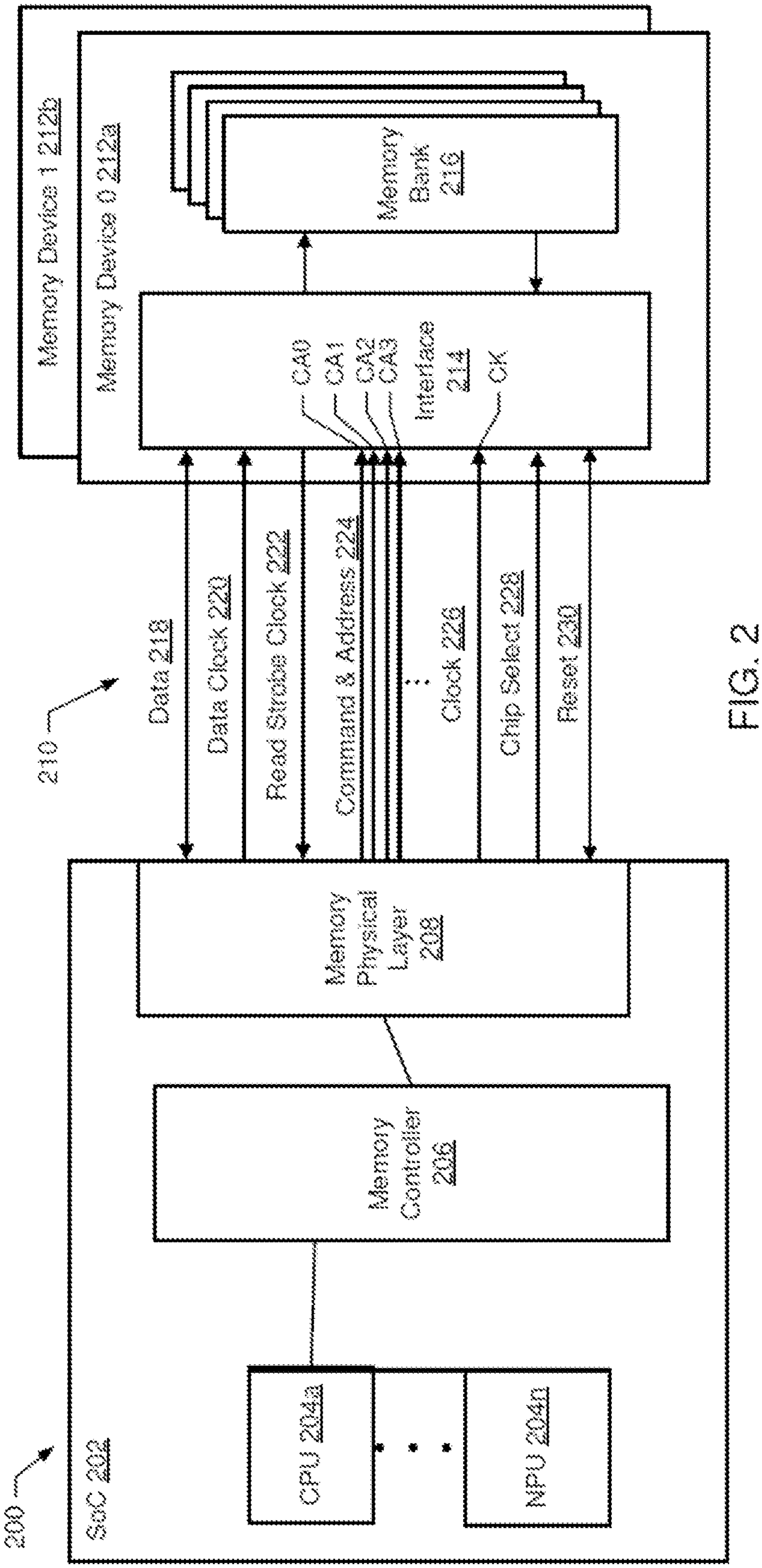
FIG. 2 is a component block diagram illustrating an example memory system suitable for implementing various embodiments.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device FIG. 2 illustrates an example memory system 200 suitable for implementing various embodiments. With reference to FIGS. 1 and 2, the example memory system 200 may include a processing system SoC 202 (e.g., SoC 12 in FIG. 1) communicatively connected to multiple memory devices 212*a*, 212*b* (e.g., memory 36 in FIG. 1) by a communication bus 210. The SoC 202 may include any number and combination of processors 204*a*-204*n* (e.g., one or more of processors 14 in FIG. 1) communicatively connected by the communication bus 210 to a memory controller 206 (e.g., memory interface 34 in FIG. 1) that is coupled to a memory physical layer 208 (e.g., a memory interface 34 in FIG. 1). Each memory device 212*a*, 212*b* may include an interface 214 communicatively connected to at least one memory bank 216.

The processors 204*a*-204*n* (e.g., a CPU, GPU, an NPU, etc.) may be configured to execute program instructions including reading and/or writing to the memory devices 212*a*, 212*b*. Memory access commands may be generated and sent by the processors 204*a*-204*n* for implementing the read and/or write instructions at the memory devices 212*a*, 212*b*.

The memory controller 206 may receive the memory access commands from any number and combination of the processors 204*a*-204*n*. The memory access commands may include information for implementing the read and/or write instructions at the memory devices 212*a*, 212*b*. Such information may include virtual and/or physical addresses of the memory devices 212*a*, 212*b* at which to implement the read and/or write instructions. The memory controller 206 may identify addresses of locations at the memory devices 212*a*, 212*b* corresponding to the addresses of the memory access commands and direct the memory access commands to the locations. In some embodiments, the addresses of the locations at the memory devices 212*a*, 212*b* may be identified by mapping or converting the addresses of the memory access commands to addresses of the locations using an algorithm and/or a mapping table, such as a mapping table stored at a translation lookaside buffer. The memory controller 206 may send the memory access commands, addresses of the locations at the memory devices 212*a*, 212*b*, and/or signals for activating the components of the memory devices 212*a*, 212*b* for the corresponding locations. In some embodiments, the memory controller 206 may be separate from the processors 204*a*-204*n*. In some embodiments, one or more memory controllers 206 may be integral to one or more of the processors 204*a*-204*n*.

In addition to providing an interface for the processors 204*a*-204*n* for read and write operations, the memory controller 206 may also be configured to control operations to refresh the memory banks 216 to maintain data stored in memory cells. By controlling read and write operations, the memory controller 206 may have or maintain information on the locations in memory, including memory banks, that are currently storing data, currently involved in read and/or write operations, and currently idle or being access infrequently. With this information available, the memory controller 206 can initiate memory refresh cycles on memory banks that are not currently engaged in supporting an ongoing process using a multi-bank memory refresh command according to various embodiments.

The physical layer 208 may receive the memory access commands, addresses of the locations at the memory devices 212*a*, 212*b*, and/or signals for activating the components of the memory devices 212*a*, 212*b* for the corresponding locations from the memory controller 206. The physical layer 208 may send the memory access commands, addresses of the locations at the memory devices 212*a*, 212*b*, and/or signals for activating the components of the memory devices 212*a*, 212*b* for the corresponding locations along with other signals via n lines in the communication bus 210, in which n is an integer value. The communication bus 210 may include various lines 218, 220, 222, 224, 226, 228, 230 coupled to pins on the memory devices 212*a*, 212*b*. In the illustrated example, the physical layer 208 may send signals for the memory access commands including: data signals via one or more data buses 218*a*, 218*b*; data clock signals via one or more data clock lines 220*a*, 220*b*; read strobe clock signals via one or more read strobe clock lines 222*a*, 222*b*; memory access commands and addresses of the locations signals via n lines in one or more command and address buses 224*a*, 224*b*, clock signals via one or more clock lines 226*a*, 226*b*; chip select signals via one or more chip select buses 228*a*, 228*b*; and/or reset signals via a reset line 230.

Depending on the addresses of the locations at the memory devices 212*a*, 212*b*, the physical layer 208 may send the signals via specific combinations of the sub-buses and lines 218, 220, 222, 224, 226, 228, 230 to each memory device interface 214. The interface 214 may interpret and/or send the signals to one or more memory banks 216 to which of the interface 214 is communicatively connected. For example, chip select signals on line 228 may be interpreted by and indicate to the interface 214 on which of the memory devices 212*a*, 212*b* to activate the communicatively connected memory banks 216 and/or implement the memory access commands at the communicatively connected memory banks 216.

In various embodiments, the memory controller 206 may cause the memory physical layer 208 to provide signals to the interface 214 via a number n of command and address bus lines 224 in combination with clock systems via line 226 to identify memory banks to be refreshed. For example, the command and address bus lines 224 may connect and provide signals to pins CA0, CA1, CA2 and CA3 of the memory device 212*a* as described in more detail herein. As described with reference to FIGS. 3A-8C, certain patterns of high and low voltage applied to pins CA0, CA1, CA2 and CA3 of the memory device 212*a* at certain clock signals (e.g., rising and falling voltages) may be interpreted by the memory device interface 214 as identifying specific multi-bank refresh operations that should be performed starting from identified memory banks. Further, commands such as a multi-bank memory refresh command may encompass m clock cycles, in which m is an integer, such as 2.

In some embodiments, the addresses of the locations at the memory devices 212*a*, 212*b* may be within a rank of one or more memory devices 212*a*, 212*b*. As referred to herein, a rank may include a memory space across multiple memory banks 216*a*, 216*b* of one memory device 212*a*, 212*b* for which at least two memory banks 216*a*, 216*b* are associated with different partial channels. For example, for a DDR dual in-line memory module (DIMM), memory devices 212*a*, 212*b* located on opposite sides of the DIMM may be part of different ranks. In some embodiments, the addresses of the locations at the memory devices 212*a*, 212*b* may be within a logical rank of multiple memory devices 212*a*, 212*b*. As referred to herein, a logical rank may include a memory space across multiple memory banks 216*a*, 216*b* of multiple memory devices 212*a*, 212*b* for which the memory banks 216*a*, 216*b* of two memory devices 212*a*, 212*b* are associated with different partial channels. For example, for a DDR DIMM, memory devices 212*a*, 212*b* located on opposite sides of the DIMM may be part of a logical rank. In some embodiments, two memory devices 212*a*, 212*b* of a logical rank may be communicatively connected to the same sub-buses and lines 218*a*, 218*b*, 220*a*, 220*b*, 222*a*, 222*b*, 224*a*, 224*b*, 226*a*, 226*b*, 228*a*, 228*b*, 230.

Various embodiments may be implemented by introducing new signaling commands for volatile memory devices (e.g., DDR and LPDDR memory devices) for controlling the refresh of memory banks in a multi-bank format that provides memory controllers with flexibility for specifying refresh of selected memory banks. In some embodiments, the memory controller may generate a refresh command that identifies a memory bank to begin refreshing and the number of memory banks to be refreshed. To provide further flexibility, in some embodiments the memory controller may generate a refresh command that identifies a memory bank to begin refreshing, the number of memory banks to be refreshed and a pattern in which memory banks are to be refreshed from the starting bank. Some embodiments may include a new multi-bank refresh command structure that encodes information identifying the memory bank to begin refreshing and the number of memory banks to be refreshed. Some embodiments may include a new multi-bank refresh command structure that encodes information identifying the memory bank to begin refreshing, the number of memory banks to be refreshed, and the pattern in which memory banks are to be refreshed from the starting bank.

A non-limiting example of a representative command structure and non-limiting examples of bit pattern translation tables according to a non-limiting embodiment are illustrated in FIGS. 3A-3D. With reference to FIGS. 1-3D, the illustrated tables represent one embodiment of command and bit pattern translation table structures, but other patterns of command and/or bit pattern translation tables are possible.

Referring to FIG. 3A, a non-limiting example multi-bank refresh command structure according to an embodiment is illustrated in table 300. This example command structure makes use of a reserved for future use (RFU) command pattern in future JEDEC specifications. However, different command patterns may be used in other embodiments, a general example of which is illustrated in FIG. 3E and described below. Further, in some embodiments, not all bits used in the example table 300 may be used or more bits may be used as per the use case and availability. For example, in some embodiments, the command structure may not specify a pattern in which memory banks are refreshed, defaulting to a sequential or incremental pattern (i.e., the identified number of memory banks are refreshed in order starting from the identified starting memory bank.

The command structure illustrated in the example table 300 identifies signals of high (H) or low (L) voltage that are applied to the volatile memory device command pins CA0, CA1, CA2 and CA3 of the memory device interface (e.g., 214) on two consecutive clock cycles (CS) on the rising (R1 or R2) edge or falling (F1 or F2) that of the clock signal to identify that it is a multi-bank refresh command. The example table 300 shows signals that identify the number of memory banks to be refreshed in one multi-bank refresh cycle, and the identity of the memory bank at which the multi-bank refresh process should begin. The example table 300 is for an embodiment in which the memory controller can also identify a pattern in which memory banks are refreshed, and thus also shows signals that identify the type of multi-bank refresh pattern that should be implemented (i.e., incremental, pairwise, step of N or diagonal as described herein).

As illustrated in table 300, a memory controller 206 and memory physical layer 208 may issue a multi-bank refresh command using the command and address lines 224 connected to the DDR command pins CA0, CA1, CA2 and CA3 by applying high voltage (H) to the CA0, CA1, and CA2 pins while applying low voltage (L) to the CA3 command pin on the rising edge of a first clock signal (i.e., as CS goes high), followed by applying low voltage to the CA0 and CA2 pins and maintaining high voltage on the CA1 pin on the falling edge of the first clock signal (i.e., as CS voltage drops to any voltage below high indicated by "x").

As part of this example multi-bank refresh command structure, the voltage (H or L) applied to the CA0, CA1 and CA3 on specific portions of two clock cycles provides three bits of information (referred to in the figures as "nB0", "nB1" and "nB2") used to specify the number of memory banks to be refreshed. In other words, in this non-limiting example, the number of bits z used to encode the number of memory banks to be refreshed as shown in FIG. 3E, the integer z equals 3. In the illustrated example, the voltage level applied to the CA3 pin on the falling edge of the first clock signal and the voltage level applied to the CA0 and CA1 pins on the rising edge of the next clock signal (referred to herein as the "second clock signal") provides three bits of information used by the memory device interface 214 in a coded algorithm or table look up process to identify the number of memory banks to be refreshed. Table 302 in FIG. 3B shows a nonlimiting example of such a table with high voltage corresponding to a "1" value bit and low voltage corresponding to a "0" value bit. To be clear, the voltage/bit values are referred to as "nB2" for the voltage level applied to the CA3 pin on the falling edge of the first clock signal, "nB1" for the voltage level applied to the CA0 pin on the rising edge of the second clock signal, and "nB0" for the voltage level applied to the CA1 pin on the rising edge of the second clock signal. Table 302 shows an example of how these three voltage/bits can be equated to different numbers of memory banks to be refreshed. The voltage/bit pattern shown in Table 302 is for illustrative purposes and other bit patterns may be used in a similar fashion.

As part of this example multi-bank refresh command structure, the voltage (H or L) applied to the CA2 and CA3 pins on the rising edge of the second clock signal provides two bits of information (with the voltage/bit values referred to in the figures as "mREF1" and "mREF0") useful for identifying the pattern in which memory banks are to be refreshed. As noted above, in some embodiments, the multi-bank refresh command structure may not include information or bits for identifying a pattern for refreshing banks, in which case memory banks may be refreshed in a default pattern (such as incremental) from the starting memory bank for the identified number of memory banks.

In the non-limiting embodiment illustrated in FIG. 3C, four alternative bank refreshing patterns are identified; incremental, pair-wise, step of N (e.g., N=2) and diagonal. Examples of how memory banks would be refreshed in each of these four example patterns are described with reference to FIGS. 4-8C. This example implementation uses just two bits within the command signal sequence to enable the memory controller to identify alternative patterns in which memory banks are refreshed, providing flexibility in identifying specific ones of multiple banks for refresh. The voltage/bit pattern shown in Table 304 is for illustrative purposes and other bit patterns may be used in a similar fashion.

As part of this example multi-bank refresh command structure, the voltage (H or L) applied to the CA0, CA1, CA2 and CA3 pins on the falling edge of the second clock signal provides four bits of information (with the voltage/bit values referred to in the figures as "BA0", "BA1", "BG0" and "BG1") useful for identifying the number of the memory bank at which refreshing should start. Table 306 in FIG. 3D provides a non-limiting example mapping of voltage/bit patterns to 16 different memory banks. This example implementation uses just four bits within the command signal sequence to enable the memory controller to identify a specific memory bank that will be refreshed first, providing flexibility in identifying specific ones of multiple banks for refresh. The voltage/bit pattern shown in Table 306 is for illustrative purposes and other bit patterns may be used in a similar fashion.

Turning to how the non-limiting signals described above would be acted upon by the memory device side, the interface 214 would recognize the applied signals as indicating a multi-bank refresh command, and use the values/voltage states applied on the command pins to determine the number of memory banks to refresh, the pattern to be followed in refreshing banks, and the memory bank at which the refresh cycle should begin. In the embodiment multi-bank refresh command structure illustrated in Table 300 of FIG. 3A, the interface 214 uses the value/voltage state applied to CA3 pin on the falling edge of the first clock cycle and the values/voltage states applied on the CA0 and CA1 pins on the rising edge of the second clock signal to identify the number of memory banks to be refreshed using a coded algorithm or table like Table 302 in FIG. 3B. The interface 214 uses the values/voltage states applied on the CA2 and CA3 pins on the rising edge of the second clock signal to identify the pattern of memory bank refreshing to be implemented in the multi-bank refresh cycle using a coded algorithm or table like Table 304 in FIG. 3C. The interface 214 uses the values/voltage states applied on the CA0, CA1, CA2 and CA3 pins on the falling edge of the second clock signal to identify the number of the memory bank at which refreshing should start using a coded algorithm or table like Table 306 in FIG. 3D. Thus, in two clock cycles the interface 214 receives the command to perform multi-bank refreshing of particularly identified memory banks, then proceeds to refresh the identified banks accordingly.

Again, FIGS. 3A-3D illustrate a particular non-limiting example of a multi-bank refresh command and associated decoding tables. FIG. 3E illustrates a general format of a multi-bank refresh command 306 that may be implemented for memory devices that have different numbers of command pins and use a number of command signal cycles to enable refreshing any number of memory banks in a wide variety of patterns using a single command. The multi-bank refresh command 306 may be suitable for memory device designs already available or as may be developed in the future. The multi-bank refresh command 306 illustrates a non-limiting of an example of fields in which op code bits, pattern code bits, number of memory bank code bits, and start bank code bits may appear. However, the op code and various encode bits may be arranged differently in some embodiments.

The example multi-bank refresh command 306 illustrated in FIG. 3E may be implemented in memory devices that include n command pins that are available for encoding a multi-bank refresh command (i.e., the command and address bus is at least n bits wide). Example locations and values of an example multi-bank refresh command op code bits are shown in the shaded fields, with example values included. As shown, the op code for a multi-bank refresh command 306 may be k bits long. The number of patterns in which memory banks may be refreshed may be 2' in which t is an integer value that is encoded in t bits. As shown, the number of memory banks to be refreshed may be encoded in z bits in which z is an integer, and the identity of the starting bank may be encoded in y bits in which y is an integer. Further, the multi-bank refresh command 306 may be completed in any number m of cycles in which m is an integer value.

The general format of the multi-bank refresh command 306 illustrated in FIG. 3E may enable the use of any number of bits and bit patterns in multi-bank refresh commands, enabling a wide range of different memory bank refresh patterns, number of memory banks to be refreshed, and the starting memory bank as may be suitable for a wide range of use cases and memory devices. For example, the number of bits available for encoding a multi-bank refresh command would be the width of the command and address bus multiplied by two times the number of clock cycles used in the command (i.e., n*2m) assuming use of both rising and falling edges of each command cycle (thus the factor of 2). However, the illustrated format is not intended to be limiting, as the locations of pattern, number and starting bank encoding bits may be arranged differently in various embodiments. Decoding tables for pattern, number and starting bank bit codes may be organized in a variety of formats, including formats similar to those illustrated in FIGS. 3B-3D.

The implementation of multi-bank refreshing according to the non-limiting embodiment illustrated in FIGS. 3A-3D may be understood by considering the examples that are illustrated in FIGS. 4-10B. These examples use the command code structure illustrated in FIG. 3A along with the example decoding tables 302-306 in FIGS. 3B-3D described above. Again, the specific values for the command code and decoding tables illustrated in FIGS. 3A-3D and used in the examples illustrated in FIGS. 4-10B is but one of many alternative data structures that could be used to implement the claims. Therefore, the examples described with reference to FIGS. 4-10B are not intended to be limiting unless specifically recited in a claim.

Figure 4:
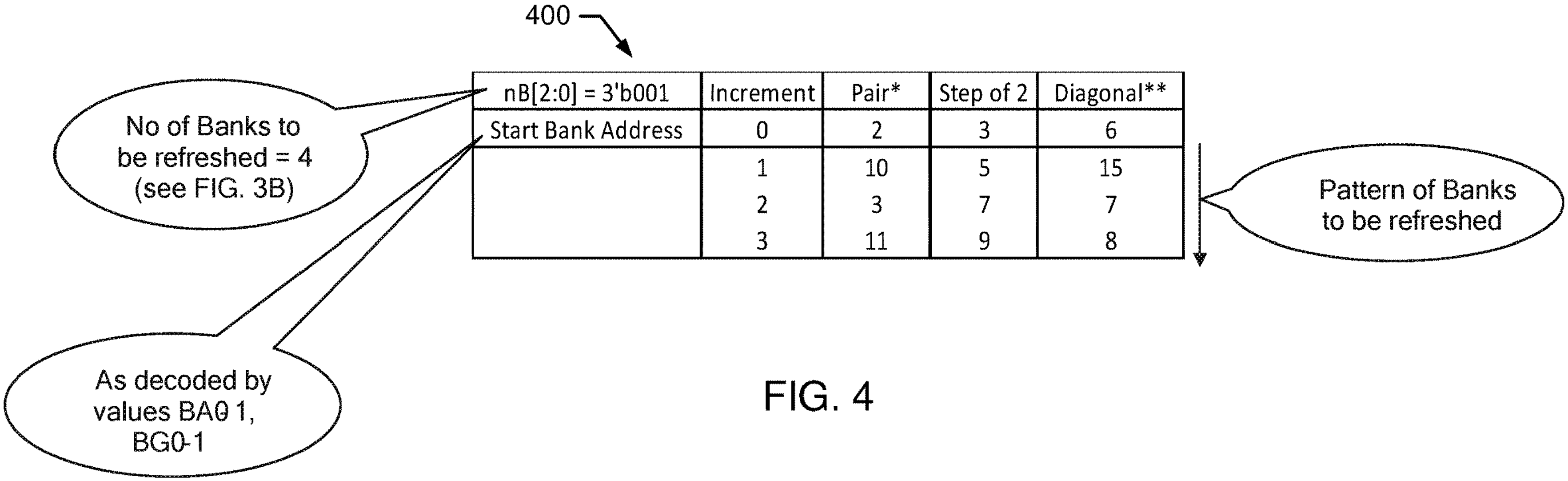
FIG. 4 is table of non-limiting examples of memory banks that would be refreshed under each of four different multi-bank memory refresh patterns with different starting memory banks according to a non-limiting embodiment.

FIG. 4 provides an example of how the memory controller can use different combinations of the number of memory banks to be refreshed (see FIG. 3B), the different memory bank refresh patterns to be followed (see FIG. 3C), and the starting bank (see FIG. 3D) to control which memory banks will be refreshed in a multi-bank refresh cycle using a single refresh command. Table 400 in FIG. 4 shows a non-limiting example of the memory bank numbers that will be refreshed for each of the memory bank refresh patterns with different starting bank numbers in the case in which the multi bank refresh command set the number of memory banks to be refreshed at four (i.e., nB2=0, nB1=0 and nB0=1 as shown in FIG. 3B). The memory banks to be refreshed shown in Table 400 are for the nonlimiting examples of Tables302, 304 and 305 illustrated in FIGS. 3B-3D, and references to specific voltage/bit patterns in the following descriptions are for illustrative purposes only based on this one nonlimiting example.

Referring to the non-limiting examples illustrated in Table 400, if the pattern of memory banks to be refreshed is set to "increment" (i.e., mREF1=0 and mREF0=0 per FIG. 3C) and the first bank to be refreshed is identified as the 0 bank (i.e., BA0=0, BA1=0, BG0=0 and BG1=0 per FIG. 3D), the memory device will refresh banks 0 through 3 sequentially starting from bank 0.

If the pattern of memory banks to be refreshed is set to "pair" (i.e., mREF1=0 and mREF0=1 per FIG. 3C) and the first bank to be refreshed is identified as the 2 bank (i.e., BA0=0, BA1=1, BG0=0 and BG1=0 per FIG. 3D), then the memory device will refresh banks 2, 10, 3 and 11 in sequence. In the pair mode, this example assumes memory bank pairs as in the LPDDR5 standard, which specifies pairs as (0,8), (1,9), (2,10) . . . (7,15). However, different pairing combinations may be used.

If the pattern of memory banks to be refreshed is set to "step of N" in which N=2 (i.e., mREF1=1 and mREF0=0 per FIG. 3C) and the first bank to be refreshed is identified as the 3 bank (i.e., BA0=1, BA1=1, BG0=0 and BG1=0 per FIG. 3D), then the memory device will refresh banks 3, 5, 7 and 9 in sequence.

Figure 5:
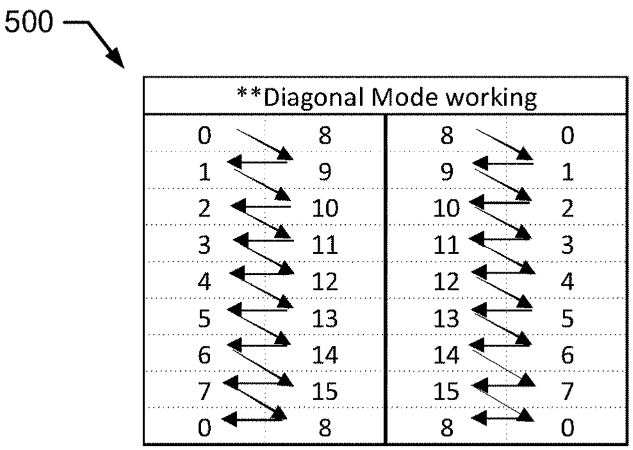
FIG. 5 is a table illustrating a sequence of memory banks that would be refreshed using a diagonal multi-bank memory refresh pattern according to a non-limiting embodiment.

Referring to FIG. 5, the illustrated table 500 illustrates an example of a diagonal refresh pattern. If the pattern of memory banks to be refreshed is set to "diagonal" (i.e., mREF1=1 and mREF0=1 per FIG. 3C) and the first bank to be refreshed is identified as bank 6 (i.e., BA0=0, BA1=1, BG0=1 and BG1=0 per FIG. 3D), then the memory device will refresh banks 6, 15, 7 and 8 in sequence. In the diagonal mode, this example assumes memory bank pairs as in the LPDDR standard and memory banks are selected in sequence as illustrated in FIG. 5. It should be understood that the diagonal pattern shown in FIG. 5 is only one of multiple different patterns that could be implemented, such as a diagonal pattern that skips one or more pairs in the sequence of memory banks that are refreshed.

FIGS. 6A-6C include table 600 and diagrams 602 and 604 that provide an example of a multi-bank command in which the command voltage/bit pattern specifies an incremental sequence of refreshing 14 memory banks beginning with memory bank 8. Specifically in example table 600, in response to the voltage/bit pattern shown in FIG. 6A, the memory device interface 214 will refresh memory banks as illustrated diagram 602 in FIG. 6B. FIG. 6C shows diagram 604 of a further aspect of various embodiments in that if a bank in the sequence has already been refreshed (e.g., due to a previous refresh cycle or a read or write process), that recently refreshed memory bank will be skipped in the multi bank refresh cycle. Thus, in the example illustrated in FIG. 6C in which bank 0 was previously refreshed, the memory device interface 214 will increment from bank 15 to bank 1 as there is no need to refresh bank 0.

Figures 7A, 7B, 7C:
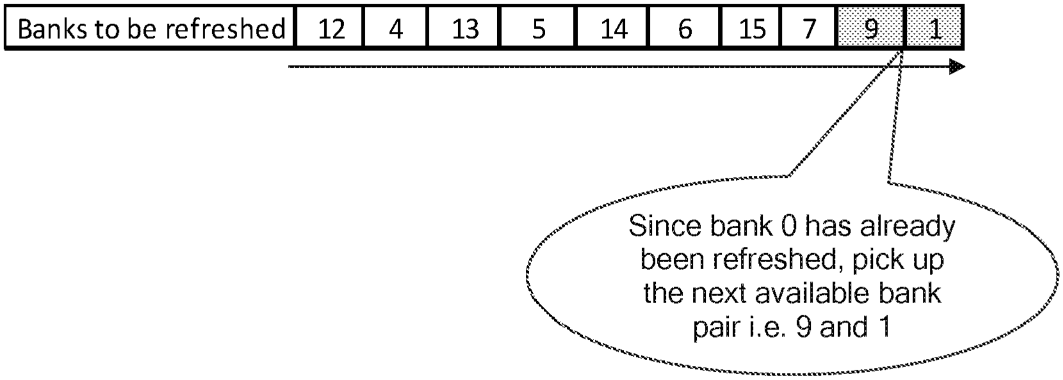
FIGS. 7A-7C are tables illustrating a non-limiting example of a multi-bank memory refresh command specifying a pairwise multi-bank memory refresh pattern and examples of the memory banks that would be refreshed in response to the command according to a non-limiting embodiment.

FIGS. 7A-7C include table 700 and diagrams 702 and 704 that provide an example of a multi-bank command in which the command voltage/bit pattern specifies pair mode sequence of refreshing 10 memory banks beginning with memory bank 12. Again, the example assumes memory bank pairs as in the LPDDR5 standard, which specifies pairs as (0,8), (1,9), (2,10) . . . (7,15). Specifically in this example, in response to the voltage/bit pattern shown in table 700 in FIG. 7A, the memory device interface 214 will refresh memory banks as illustrated in diagram 702 in FIG. 7B. Diagram 704 in FIG. 7C shows that if bank 0 was previously refreshed, the memory device interface 214 will skip that memory bank (i.e., 0) and its pair (i.e., 8) because they were already refreshed and proceed with the pairwise refreshing of memory banks continuing with the next higher pair of memory banks (i.e., banks 9 and 1) as illustrated.

FIGS. 8A-8C include table 800 and diagrams 802 and 804 that provide an example of a multi-bank command in which the command voltage/bit pattern specifies a step of N in which N=2 mode sequence of refreshing 10 memory banks beginning with memory bank 2. A stepwise pattern may refresh every Nth memory bank from the starting memory bank. In the non-limiting example of stepwise memory bank refreshing used to show how a stepwise pattern may be implemented N is equal to 2. However, N may be any integer value greater than 1 (e.g., 3, 4, 5, etc.). In this example of N=2, in response to the voltage/bit pattern shown in table 800 in FIG. 8A, the memory device interface 214 will refresh every other memory bank starting from bank 2 as illustrated diagram 802 in FIG. 8B. Note that in the sequence of memory bank fresh operations shown in FIG. 8B, memory bank 2 will have been refreshed in the same cycle, so when that memory bank is reached in the step of 2 mode sequence, the memory device interface 214 will select the next higher bank for refresh (i.e., bank 3), with the step of 2 mode refreshing of memory banks continuing from there. Diagram 804 in FIG. 8C shows that if bank 0 was previously refreshed, the memory device interface 214 will skip that already refreshed memory bank and proceed with the step of 2 mode pattern of refreshing of memory banks continuing with the next higher bank (i.e., bank 1) as illustrated.

FIGS. 9A-9C include table 900 and diagrams 902 and 904 that provide an example of a multi-bank command in which the command voltage/bit pattern specifies a diagonal mode sequence of refreshing 8 memory banks beginning with memory bank 6. Specifically in this example, in response to the voltage/bit pattern shown in table 900 in FIG. 9A, the memory device interface 214 will refresh memory banks according to a diagonal pattern shown in FIG. 3C starting from bank 6 as illustrated in diagram 902 FIG. 9B. Diagram 904 FIG. 9C shows that if bank 0 was previously refreshed, the memory device interface 214 will skip that already refreshed memory bank and proceed with the diagonal mode pattern of refreshing of memory banks continuing with the next higher bank in the diagonal mode sequence (i.e., bank 9) as illustrated.

Figure 10A:
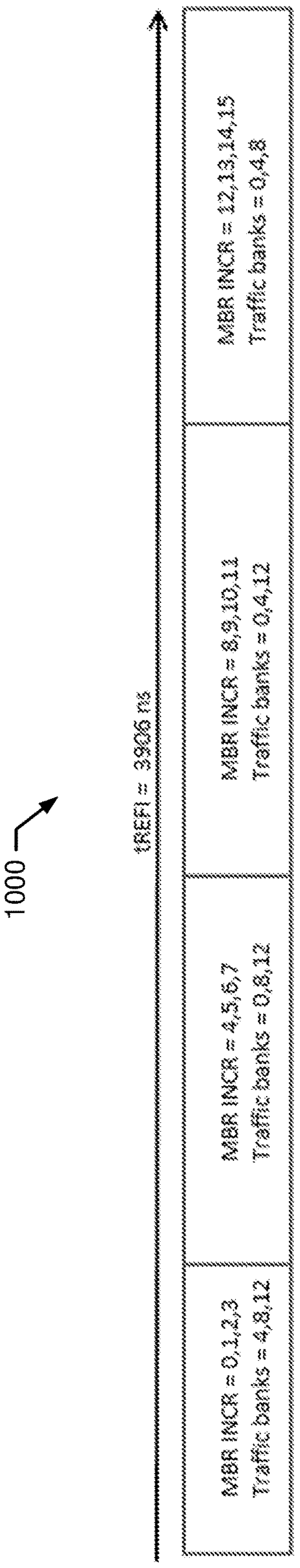
FIGS. 10A and 10B are illustrations of examples of 1X and 4X memory bank refresh rates showing different non-limiting examples of implementation techniques.
Figure 10B:
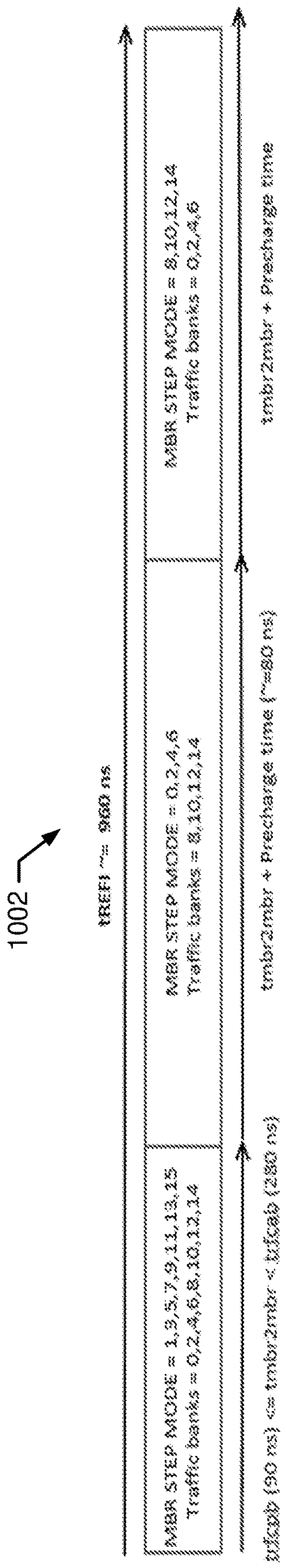

The benefit of a multi-bank memory refresh command can be appreciated with reference to FIGS. 10A and 10B. With reference to FIGS. 1-10B, multi-bank refresh cycles are illustrated for different refresh patterns (i.e., incremental and step of 2 mode) and different numbers of memory banks refreshed in each commanded refresh cycle. Also, examples of memory banks that the memory controller 206 may access for writing and storing data (referred to as data traffic) turning each memory bank refresh cycle are listed.

FIG. 10A shows an implementation in diagram 1000 in which the memory controller 206 has issued a sequence of incremental multi-bank memory refresh commands that include refreshing of the 0, 1, 2, 3 memory banks while enabling use (i.e., traffic) on memory banks 4, 8, 12, followed by refreshing of the 4, 5, 6, 7 memory banks while traffic is permitted on memory banks 0, 8, 12, followed by refreshing of the 8, 9, 10, 11 memory banks while data traffic is permitted on memory banks 0, 4, 12, followed by refreshing of the 12, 13, 14, 15 memory banks while enabling data traffic on memory banks 0, 4, 8, all without any interruption due to memory bank refreshing.

FIG. 10B shows an example implementation in diagram 1002 that may be useful in automotive applications in which high operating temperatures require memory banks to be refreshed often. This requirement for frequent refreshing can lead to performance impacts. Using multi-bank memory refresh commands, some memory banks may remain available for data traffic while many banks are refreshed. In the example illustrated in FIG. 10B, the memory controller 206 has issued a sequence of step of 2 mode multi-bank memory refresh commands in which every other memory bank is refreshed (e.g., memory banks 1, 3, 5, 7, 9, 11, 13, 15 in the first command), which leaves the other memory banks (e.g., memory banks 0, 2, 4, 6, 8, 10, 12, 14) available during that refresh cycle for handling data traffic. FIG. 10B also illustrates that the memory controller 206 has flexibility in defining the number of memory banks that are refreshed in each cycle, such as eight in the first illustrated refresh cycle, four in the second refresh cycle, and four in the third illustrated refresh cycle.

Figure 11:
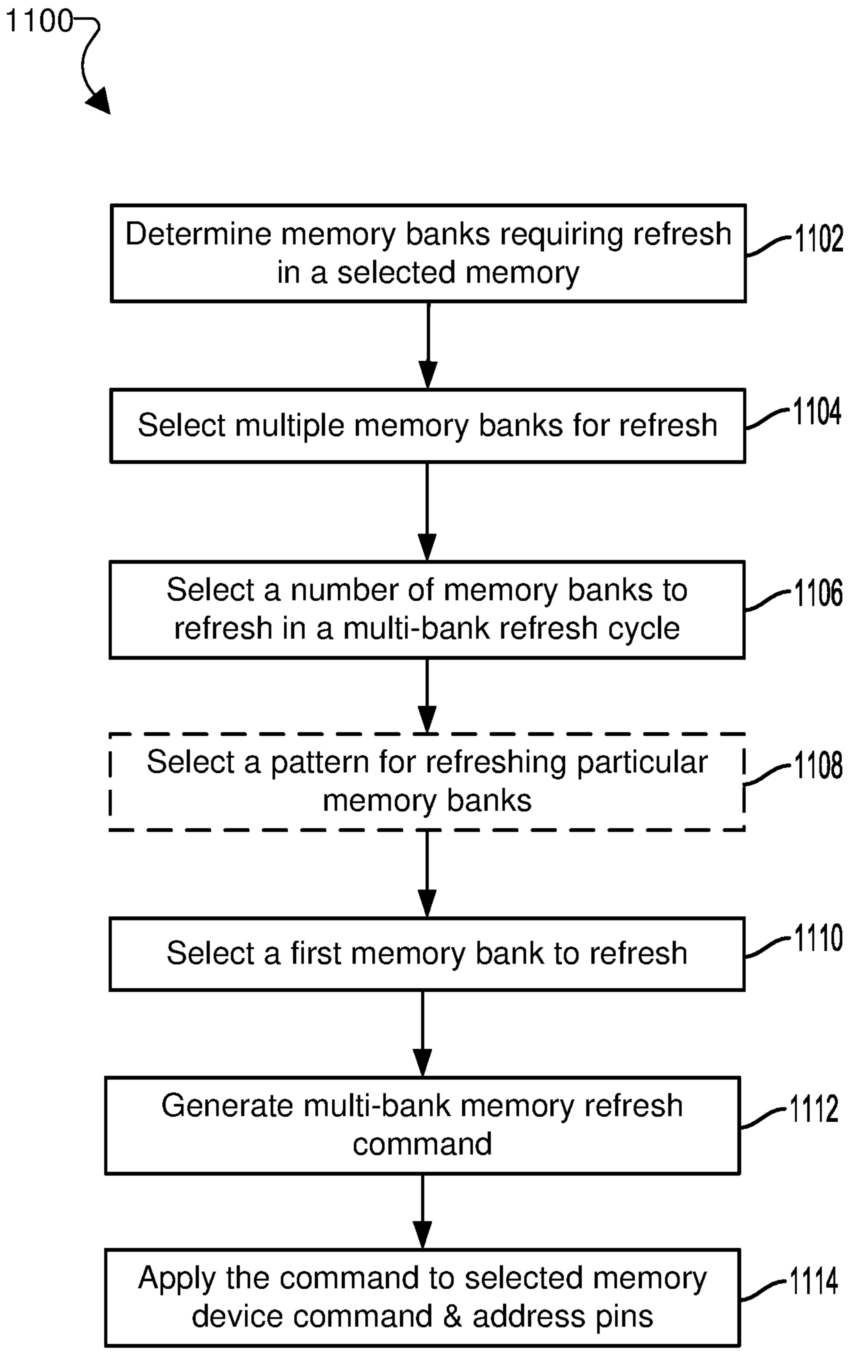
FIG. 11 is a process flow diagram illustrating an embodiment method of implementing multi-bank memory refresh commands by a memory controller.

FIG. 11 is a process flow diagram illustrating a method 1100 that a memory controller of a computing device may follow in issuing a multi-bank memory refresh command in accordance with some embodiments. With reference to FIGS. 1-11, the method 1100 may be performed by a processor or processing system within a memory controller (e.g., 206) of a computing device (e.g., 10) by a processing system encompassing one or more processors, components or subsystems discussed in this application. Means for performing the functions of the operations in the method 1100 may include a memory controller (e.g., 206) a memory physical layer (e.g., 208), a data bus (e.g., 210) and other components described herein. Further, the memory controller may include one or more processors of a processing system that may be configured with software or firmware to perform some or all of the operations of the method 1100.

In block 1102, the memory controller may determine when and which memory banks require refresh as part of the normal operations of managing dynamic memory. This may include identifying those memory banks that have not been refreshed within a period of time that depends on temperature and other factors such that voltage decay could lead to loss of data. As part of the operations in block 1102, the memory controller may also select one of multiple memories coupled to and controlled by the memory controller.

In block 1104, the memory controller may select particular memory banks for refresh. In this operation, the memory controller may also select memory banks that should remain available for write and read operations during that memory refresh cycle. The particular memory banks selected for refresh may depend upon factors such as the operating temperature (which may determine how frequently memory banks must be refreshed), current read and write operations being performed in various memory banks, and other operational considerations.

In some instances, depending on current read and write operations and memory banks currently in use or recently refreshed, it may not be efficient to refresh all of the memory banks selected in block 1104 in a single multi-bank refresh command. Therefore, in block 1106, the memory controller may select a number of memory banks to refresh using a multi-memory bank refresh command in a given memory refresh interval (tREFI). Selection of the number of memory banks to be refreshed in a given multi-bank refresh command may depend on how many memory banks will require refreshing within the next refresh cycle, distribution of the memory banks requiring refresh, a pattern of refreshing (determined in block 1108) suitable for efficiently refreshing at least some of the memory banks in one cycle, and operational considerations, such as the rate at which memory banks are being written and read. In some instances, the operations in block 1106 need not be performed because the selection of memory banks to refresh using a single multi-bank refresh command in block 1104 also identifies the number of memory banks to refresh using the command.

In block 1108, the memory controller may select a pattern for refreshing particular memory banks. The memory controller may select from among various refresh patterns supported by the multi-bank memory refresh commands implemented on the memory device. For example, in the embodiment illustrated in FIG. 3C, the memory controller may select from among incremental, pairwise, step of N, and diagonal patterns of memory bank refreshing. The selection made depend upon the pattern of memory banks that require refreshing (e.g., determined in block 1102), the number of memory banks that require refreshing (e.g., determined in blocks 1104 and 1106), and operational considerations such as the number and pattern of memory banks that are written and read. By providing a number of different patterns available in the multi-bank memory refresh command, the memory controller is provided with flexibility for refreshing memory banks in a manner that facilitates continued access to memory banks and reduces congestion on the command and address lines.

In block 1110, the memory controller may select a first memory bank to refresh in a multi-bank refresh cycle. The selection of the first memory banks to refresh may depend upon the pattern of memory refresh selected as well as other considerations.

In block 1112, the memory controller may generate a multibank memory refresh command that specifies the number of memory banks to refresh in the multi-bank refresh cycle (as determined in block 1106), the pattern of refreshing of memory banks (such as selected in block 1108) and identify the first memory bank two refresh parentheses such as selected in block 1110). In generating the multi-bank refresh command, the memory controller may encode this information into digital or signal formats similar to those illustrated in FIGS. 3A-3D, although the specific patterns used in such signaling (e.g., data tables) may vary the nonlimiting examples illustrated in the figures.

In block 1114, the memory controller may cause the memory physical layer (e.g., 208) to apply the corresponding voltage levels to the command and address pins on the selected memory device, thereby causing the memory device to implement the multi-bank refresh.

The operations in the method 1100 may be performed repeatedly or periodically to refresh memory banks in selected memory devices, particularly when multi-bank memory refresh methods are suitable to current operating conditions or may improve performance of the computing device.

Figure 12:
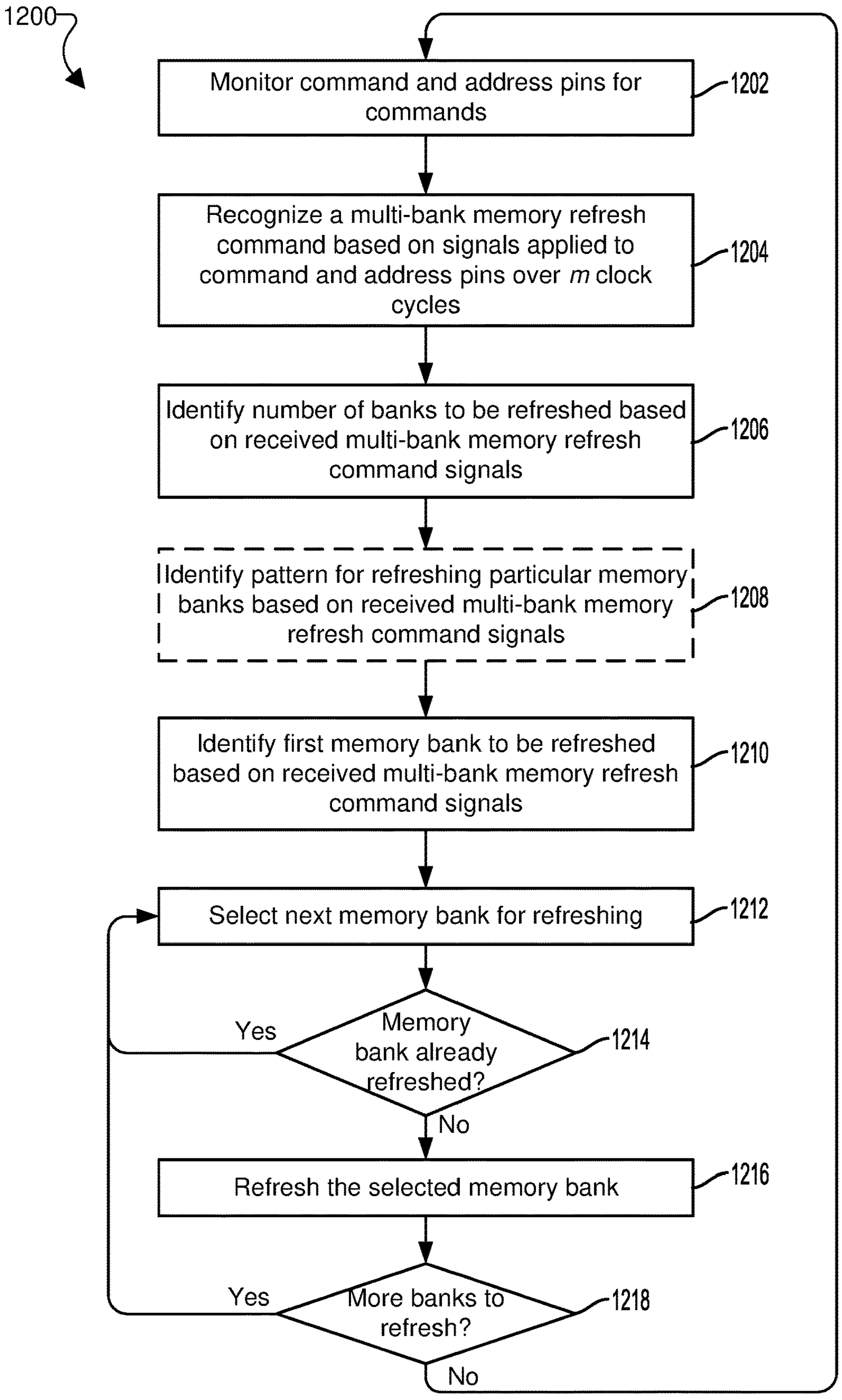
FIG. 12 is a process flow diagram illustrating an embodiment method of implementing a multi-bank memory refresh command by a memory device.

FIG. 12 is a process flow diagram illustrating a method 1200 that a memory device may follow in implementing a multi-bank memory refresh command in accordance with some embodiments. With reference to FIGS. 1-12, the method 1200 may be performed by a processor or processing system within a memory device (e.g., 212*a*, 212*b*), such as a memory device interface (e.g., 214). Means for performing the functions of the operations in the method 1200 may include a memory device interface (e.g., 214), input pins (CA0, CA1, CA2, CA3, CK) for command and address input and clock signals, and memory banks (e.g., 216), and other components described herein. Further, the memory device and/or the interface may include one or more processors of a processing system that may be configured with software or firmware to perform some or all of the operations of the method 1200.

In block 1202, the memory device interface may monitor command and address pins for memory commands.

In block 1204, the memory device interface may recognize a multi-bank memory refresh command based on the signals that are applied to the command and address pins over two clock cycles. Non-limiting examples of signal patterns that could be used for a multi-bank memory refresh commands are described with reference to FIGS. 3A-3D. Other patterns of command and address pins signals may be used in some embodiments. In block 1206, the memory device interface may identify the number of memory banks to be refreshed in a given multi-bank memory refresh cycle based on the received multibank memory refresh command signals. In block 1208, the memory device interface may identify the pattern of refreshing particular memory banks that should be implemented in the given refresh cycle based on the received multi-bank memory refresh command signals. In block 1210, the memory device interface may identify the first memory bank to be refreshed based on the received multi-by memory refresh command signals. In some embodiments, the operation in blocks 1204-1210 may be performed in a single or combined operation including receiving and decoding the signals received on the memory device command and address pins over two clock cycles as described herein.

In block 1212, the memory device interface (or another component of the memory device) may select the next memory bank to be refreshed based on the identified first memory bank to be refreshed (e.g., determined in block 1210). At the start of a multi-bank memory refresh cycle, the memory device interface may select the first memory bank to be refreshed that was identified in the received multi-bank memory refresh command. Thereafter, the memory device interface may select the next memory bank to refresh based on the identified pattern for refreshing particular memory banks (e.g., determined in block 1208).

In determination block 1214, the memory device interface (or other complement) may determine whether the selected memory bank has already been refreshed within a threshold amount of time, and thus does not require refreshing in the current refresh cycle.

In response to determining that the selected memory bank has already been refreshed (i.e., determination block 214="Yes"), the memory device interface may again select the next memory bank for refreshing in block 1212, thereby skipping a memory bank that does not require refreshing.

In response to determining that the selected memory bank has not already been refreshed (i.e., determination block 1214="No"), the memory device may refresh that selected memory bank in block 1216.

In determination block 1218, the memory device interface may determine whether there are more memory banks to refresh in the current multi-bank memory refresh cycle. This determination may be based on the identified number of memory banks to be refreshed in the given cycle (e.g., determined in block 1206) and the number of memory banks that have been refreshed in the given cycle.

In response to determining that there are more memory banks to refresh (i.e., determination block 1218="Yes"), the memory device interface may select the next memory bank for refreshing in block 1212 as described. In other words, if the memory device interface determines that the identified number of memory banks have not yet been refreshed, the memory device interface may continue the multi-bank memory refresh process by selecting the next memory bank to be refreshed in block 1212.

In response to determining that all memory banks have been refreshed in the givens multi-bank memory refresh cycle (i.e., determination block 1218="No"), the memory device interface may return to monitoring the command and address pins for further commands in block 1202 as described. In other words, if the memory device interface determines that the identified number of memory banks have been refreshed, the memory device interface may end the multi-bank memory refresh cycle and begin monitoring command and address pins for the next memory device command.

Figure 13:
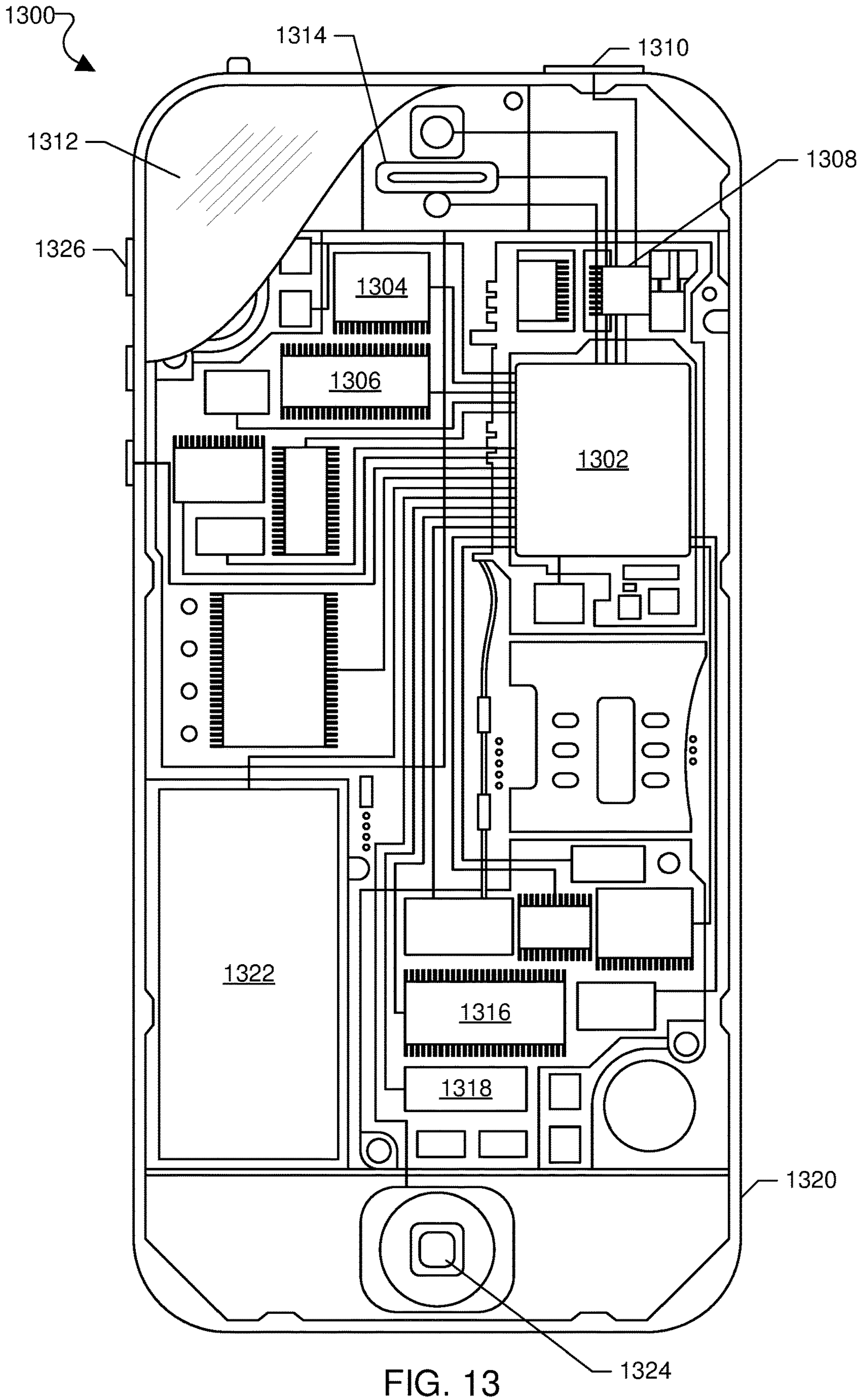
FIG. 13 is a component block diagram illustrating an example mobile computing device suitable for implementing various embodiments.

A computing device suitable for implementing various embodiments (including, but not limited to, embodiments described above with reference to FIGS. 1-12) may be implemented in a wide variety of computing systems including mobile computing devices, an example of which suitable for use with the various embodiments is illustrated in FIG. 13. The mobile computing device 1300 may include a processor 1302 coupled to a touchscreen controller 1304 and an internal memory 1306. The processor 1302 may be one or more multicore integrated circuits designated for general or specific processing tasks. The internal memory 1306 may be volatile or non-volatile memory, and may also be secure and/or encrypted memory, or unsecure and/or unencrypted memory, or any combination thereof. Examples of memory types that can be leveraged include but are not limited to DDR, Low-Power DDR (LPDDR), Graphics DDR (GDDR), WIDEIO, RAM, Dynamic RAM (DRAM), Parameter RAM (P-RAM), Resistive RAM (R-RAM), Magnetoresistive RAM (M-RAM), Spin-Transfer Torque RAM (STT-RAM), and embedded DRAM. The touchscreen controller 1304 and the processor 1302 may also be coupled to a touchscreen panel 1312, such as a resistive-sensing touchscreen, capacitive-sensing touchscreen, infrared sensing touchscreen, etc. Additionally, the display of the mobile computing device 1300 need not have touch screen capability.

The mobile computing device 1300 may have one or more radio signal transceivers 1308 (e.g., Peanut, Bluetooth, ZigBee, Wi-Fi, RF radio) and antennae 1310, for sending and receiving communications, coupled to each other and/or to the processor 1302. The transceivers 1308 and antennae 1310 may be used with the above-mentioned circuitry to implement the various wireless transmission protocol stacks and interfaces. The mobile computing device 1300 may include a cellular network wireless modem chip 1316 that enables communication via a cellular network and is coupled to the processor.

The mobile computing device 1300 may include a peripheral device connection interface 1318 coupled to the processor 1302. The peripheral device connection interface 1318 may be singularly configured to accept one type of connection, or may be configured to accept various types of physical and communication connections, common or proprietary, such as Universal Serial Bus (USB), FireWire, Thunderbolt, or PCIe. The peripheral device connection interface 1318 may also be coupled to a similarly configured peripheral device connection port (not shown).

The mobile computing device 1300 may also include speakers 1314 for providing audio outputs. The mobile computing device 1300 may also include a housing 1320, constructed of a plastic, metal, or a combination of materials, for containing all or some of the components described herein. The mobile computing device 1300 may include a power source 1322 coupled to the processor 1302, such as a disposable or rechargeable battery. The rechargeable battery may also be coupled to the peripheral device connection port to receive a charging current from a source external to the mobile computing device 1300. The mobile computing device 1300 may also include a physical button 1324 for receiving user inputs. The mobile computing device 1300 may also include a power button 1326 for turning the mobile computing device 1300 on and off.

Figure 14:
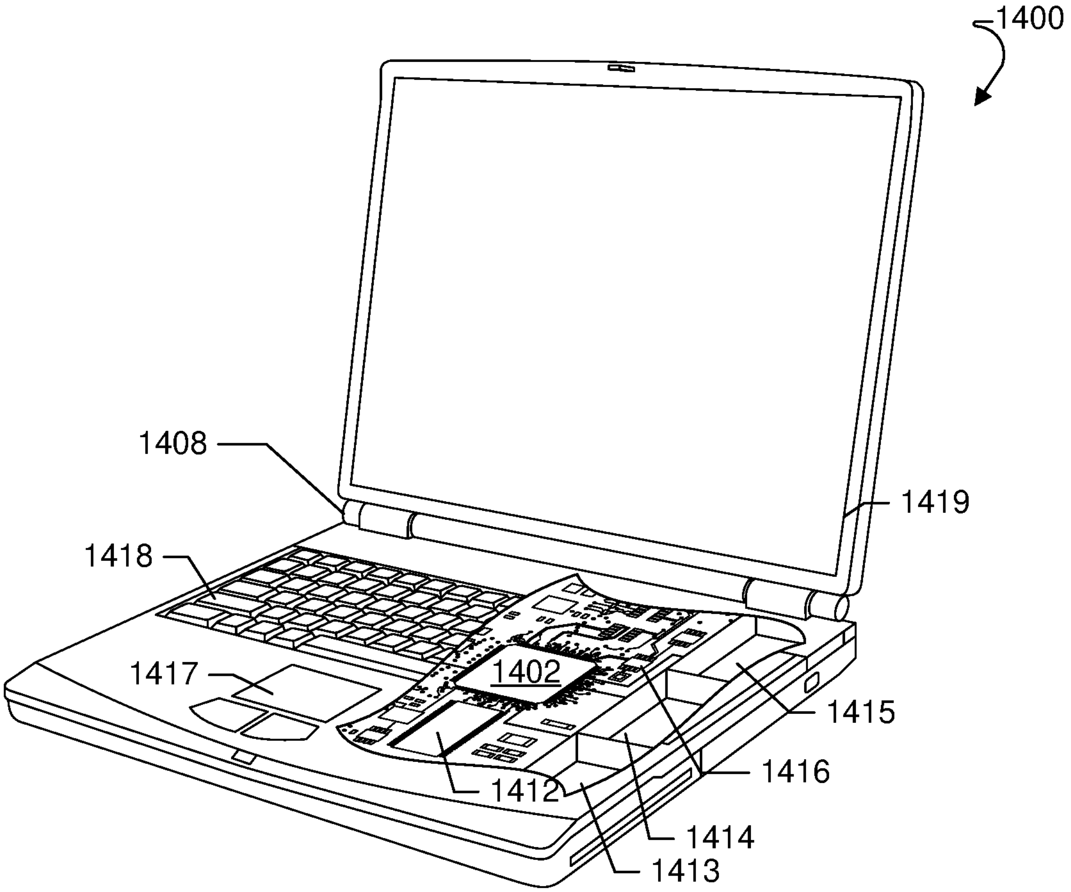
FIG. 14 is a component block diagram illustrating an example laptop computing device suitable for implementing various embodiments.

An example computing device suitable for implementing various embodiments (including, but not limited to, embodiments described above with reference to FIGS. 1-12) may be implemented in a wide variety of computing systems include a laptop computer 1400, an example of which is illustrated in FIG. 14. Many laptop computers include a touchpad touch surface 1417 that serves as the computer's pointing device, and thus may receive drag, scroll, and flick gestures similar to those implemented on computing devices equipped with a touch screen display and described above. A laptop computer 1400 will typically include a processor 1402 coupled to volatile memory 1412 and a large capacity nonvolatile memory, such as a disk drive 1413 of Flash memory. Additionally, the computer 1400 may have one or more antenna 1408 for sending and receiving electromagnetic radiation that may be connected to a wireless data link and/or cellular telephone transceiver 1416 coupled to the processor 1402. The computer 1400 may also include a floppy disc drive 1414 and a compact disc (CD) drive 1415 coupled to the processor 1402. In a notebook configuration, the computer housing includes the touchpad 1417, the keyboard 1418, and the display 1419 all coupled to the processor 1402. Other configurations of the computing device may include a computer mouse or trackball coupled to the processor (e.g., via a USB input) as are well known, which may also be used in conjunction with the various embodiments.

Figure 15:
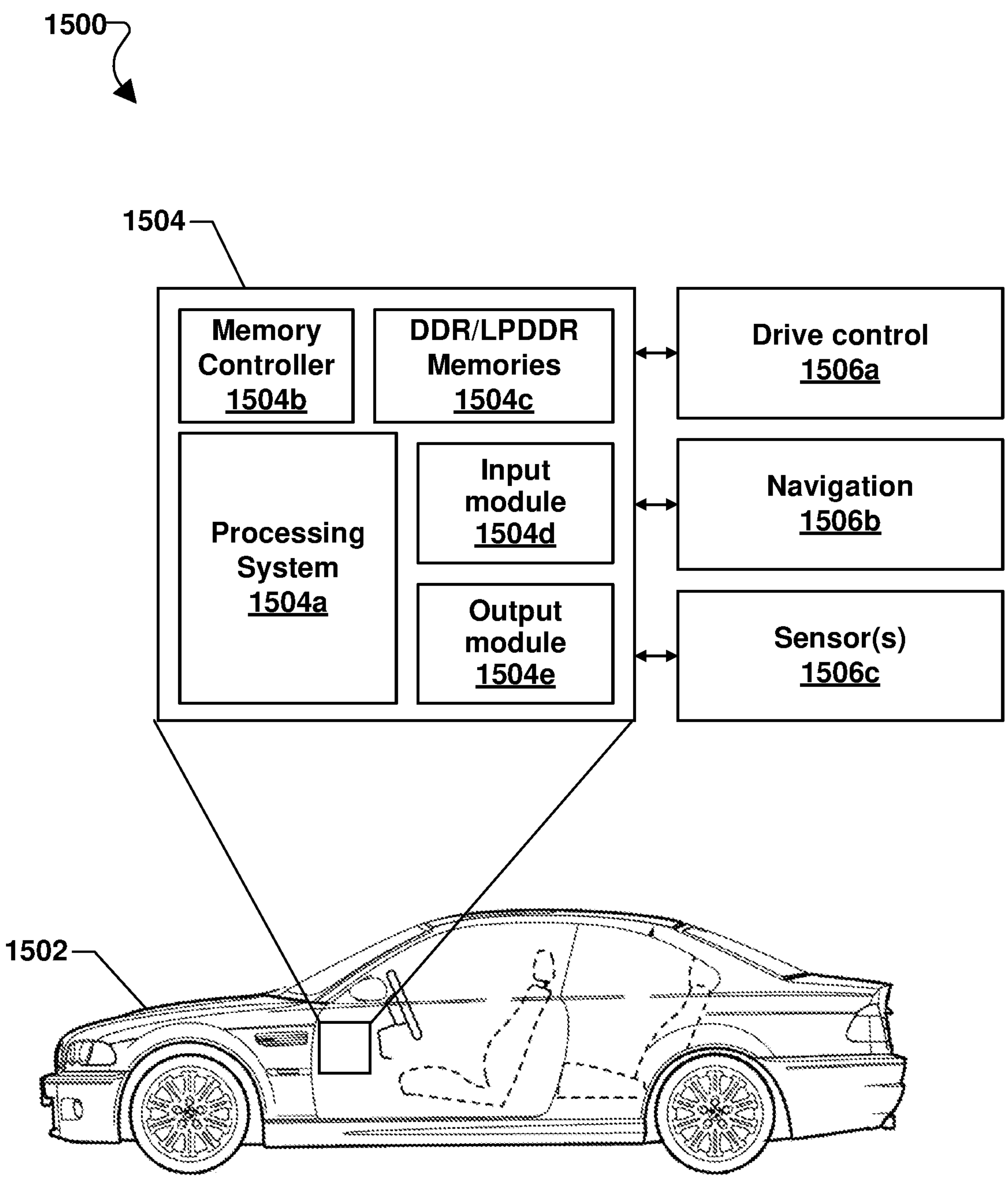
FIG. 15 is a component block diagram illustrating an example embedded vehicle computing system suitable for implementing various embodiments.

Methods and devices for implementing such methods in accordance with the various embodiments (including, but not limited to, embodiments described above with reference to FIGS. 1-15) may be implemented in a wide variety of computing systems including a vehicle system 1500 an example of which is illustrated in FIG. 15. A vehicle 1502 may include an embedded vehicle computing system 1504 that may include a processing system **1504*a*, a memory controller 1504*b* coupled to one or more memories 1504*c*, an input module 1504*d* and an output module 1504*e***.

The vehicle computing system 1504 may be coupled to and configured to control drive control components **1506*a*, navigation components 1506*b*, and one or more sensors 1506*c* of the vehicle system 1500. The processor 1504*a* may be configured with processor-executable instructions to control maneuvering, navigation, and/or other operations of the vehicle, including operations of various embodiments, including gathering and analyzing real-world vehicle run data gathered from the sensors 1506*c*. The input module 1504*c* may receive sensor data from one or more vehicle sensors 1506*c* as well as electronic signals from other components, including the drive control components 1506*a* and the navigation components 1506*b*. The output module 1504*d* may communicate with or activate various components of the embedded vehicle computing system 1500, including drive control components 1506*a*, navigation components 1506*b*, and vehicle sensor(s) 1506*c***.

The vehicle computing system 1504 may be coupled to drive control components **1506*a* to control various elements of the vehicle related to maneuvering and navigation of the vehicle, such as the engine, motors, throttles, steering elements, braking or deceleration elements, and the like. The drive control components 1506*a*** may also include components that control other devices of the vehicle, including interior environment controls (e.g., air conditioning and heating), external and/or interior lighting, interior and/or exterior informational displays (which may include a display screen or other devices to display information), safety devices (e.g., haptic devices, audible alarms, etc.), and other similar devices.

The vehicle computing system 1504 may be coupled to navigation components 1506*b*, and may receive data from the navigation components 1506*b* and be configured to use such data to determine the present position and orientation of the vehicle, as well as an appropriate course toward a destination. The navigation components 1506*b* may include or be coupled to a Global Navigation Satellite System (GNSS) receiver system (e.g., one or more Global Positioning System (GPS) receivers) enabling the embedded vehicle computing system 1000 to determine its current position using GNSS signals. Through control of the drive control elements 1506*a*, the processor 1504*a* may control the vehicle to navigate and maneuver.

The vehicle computing system 1504 may be coupled to one or more sensors 1506*c*. The sensor(s) 1506*c* may be configured to provide a variety of data to the processing system 1504*a*.

While the vehicle computing system 1504 is described as including separate components, in some embodiments some or all of the components (e.g., processing system 1504*a*, memory controller 1504*b*, memories 1504*c*, input module 1504*d*, and output module 1504*e*) may be integrated in a single device or module, such as an SIP or SoC processing system. For example, an SoC processing device may be configured for use in vehicles and configured with processor-executable instructions to perform operations of navigation and collision avoidance.

Implementation examples are described in the following paragraphs. While some of the following implementation examples are described in terms of example systems, devices, or methods, further example implementations may include: the example systems or devices discussed in the following paragraphs implemented as a method executing operations of the example systems or devices; the example systems, devices, or methods discussed in the following paragraphs implemented by a computing device including one or more memory controllers and one or more memory devices configured to perform operations of the example systems, devices, or methods; the example systems, devices, or methods discussed in the following paragraphs implemented by a computing device including one or more memory devices and means for performing functions of the example methods; and the example systems, devices, or methods discussed in the following paragraphs implemented as a non-transitory processor-readable storage medium having stored thereon processor-executable instructions configured to cause a processor of a memory controller or memory device to perform the operations of the example systems, devices, or methods.

Example 1. A method of performing multi-memory bank refreshes of volatile memory devices performed by a memory controller, including: selecting a number of memory banks to refresh in a multi-bank memory refresh cycle; selecting a first memory bank to refresh in the multi-bank refresh cycle; and applying a multi-bank of memory refresh command to a memory device, in which the multi-bank of memory refresh command encodes the number of memory banks to be refreshed, and the first memory bank to refresh.

Example 2. The method of example 1, in which: the multi-bank of memory refresh command encodes the number of memory banks to be refreshed in z bits, in which z is an integer; and the multi-bank of memory refresh command is completed in m clock cycles, in which m is an integer.

Example 3. The method of example 2, in which z equals 3 and m equals 2.

Example 4. The method of any of examples 1-3, further including selecting one of a plurality of different patterns of memory bank refreshing sequences, in which the multi-bank of memory refresh command also encodes the pattern for refreshing particular memory banks.

Example 5. The method of example 4, in which selecting one of a plurality of different patterns of memory bank refreshing sequences includes selecting one of an incremental pattern, a pairwise pattern based on pairs of memory banks specified for the memory device, a step of N pattern, or a diagonal pattern based on the pairs of memory banks specified for the memory device.

Example 6. The method of example 5, in which in N equals 2.

Example 7. A method of implementing a multi-bank memory refresh command on a memory device, including: recognizing a multi-bank memory refresh command based on signals applied to command and address pins over a number m of clock cycles, in which m is an integer; identifying a number of memory banks to be refreshed based on the signals applied to the command and address pins over the m clock cycles; identifying a first memory bank to be refreshed based on the signals applied to the command and address pins over at least one clock cycle; and refreshing the identified number of memory banks within the memory device starting from the identified first memory bank.

Example 8. The method of example 7, in which m equals 2.

Example 9. The method of either of examples 7 or 8, in which the multi-bank of memory refresh command encodes the number of memory banks to be refreshed in *z* bits, in which *z* is an integer.

Example 10. The method of example 9, in which z equals 3.

Example 11. The method of any of examples 7-10, further including: identifying a pattern for refreshing particular memory banks based on the signals applied to the command and address pins over at least one clock cycle; and refreshing the identified number of memory banks within the memory device according to the pattern for refreshing particular memory starting from the identified first memory bank.

Example 12. The method of example 11, further including: selecting a next memory bank for refreshing according to the identified pattern for refreshing particular memory banks; determining whether the selected memory bank has already been refreshed; refreshing the selected memory bank in response to determining that the selected memory bank has not already been refreshed; and selecting a next memory bank for refreshing in response to determining that the selected memory bank has already been refreshed.

Example 13. The method of example 7, further including: determining whether the identified number of memory banks have been refreshed; selecting the next memory bank for refreshing in response to determining that the identified number of memory banks have not yet been refreshed; and ending the multi-bank memory refresh in response to determining that the identified number of memory banks have been refreshed.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method of performing multi-memory bank refreshes of volatile memory devices performed by a memory controller, comprising:

selecting a number of memory banks within a plurality of memory banks to refresh in a multi-bank memory refresh cycle;

selecting a first memory bank within the plurality of memory banks to refresh in the multi-bank refresh cycle; and sending a multi-bank of memory refresh command to a memory device by high or low voltage to a command and address bus on specific portions of two clock cycles, wherein the multi-bank of memory refresh command encodes the number of memory banks to be refreshed and the first memory bank to refresh in second clock cycle of the two clock cycles, and wherein the memory device is configured to refresh the number of memory bank including the first memory bank in response to the multi-bank of memory refresh command.

2. The method of claim 1, wherein:

the multi-bank of memory refresh command encodes the number of memory banks to be refreshed in z bits, wherein z is an integer; and the multi-bank of memory refresh command is completed in m clock cycles, wherein m is an integer.

3. The method of claim 2, wherein z equals 3 and m equals 2.

4. The method of claim 1, further comprising selecting one of a plurality of different patterns of memory bank refreshing sequences, wherein the multi-bank of memory refresh command also encodes the pattern for refreshing particular memory banks.

5. The method of claim 4, wherein selecting one of a plurality of different patterns of memory bank refreshing sequences comprises selecting one of an incremental pattern, a pairwise pattern based on pairs of memory banks specified for the memory device, a step of N pattern to refresh every Nth memory bank from the first memory bank, or a diagonal pattern based on the pairs of memory banks specified for the memory device.

6. The method of claim 5, wherein in N equals 2.

7. A memory controller, comprising:

a command and address bus configure to connect to a volatile memory device; and a processing system coupled to the command and address bus, and configured to:

select a number of memory banks within a plurality of memory banks to refresh in a multi-bank memory refresh cycle;

select a first memory bank within the plurality of memory banks to refresh in the multi-bank refresh cycle; and send a multi-bank of memory refresh command to the volatile memory device by high or low voltage to the command and address bus on specific portions of two clock cycles, wherein the multi-bank of memory refresh command encodes the number of memory banks to be refreshed and the first memory bank to refresh in second clock cycle of the two clock cycles, and wherein the memory device is configured to refresh the number of memory bank including the first memory bank in response to the multi-bank of memory refresh command.

8. The memory controller of claim 7, wherein:

the multi-bank of memory refresh command encodes the number of memory banks to be refreshed in z bits, wherein z is an integer; and the multi-bank of memory refresh command is completed in m clock cycles, wherein m is an integer.

9. The memory controller of claim 8, wherein z equals 3 and m equals 2.

10. The memory controller of claim 7, further comprising selecting one of a plurality of different patterns of memory bank refreshing sequences, wherein the multi-bank of memory refresh command also encodes the pattern for refreshing particular memory banks.

11. The memory controller of claim 10, wherein selecting one of a plurality of different patterns of memory bank refreshing sequences comprises selecting one of an incremental pattern, a pairwise pattern based on pairs of memory banks specified for the memory device, a step of N pattern to refresh every Nth memory bank from the first memory bank, or a diagonal pattern based on the pairs of memory banks specified for the memory device.

12. The memory controller of claim 11, wherein in N equals 2.

* * * * *